(12) United States Patent
Yamazaki et al.

(10) Patent No.: US 11,355,645 B2
(45) Date of Patent: Jun. 7, 2022

(54) SEMICONDUCTOR DEVICE COMPRISING STACKED OXIDE SEMICONDUCTOR LAYERS

(71) Applicant: Semiconductor Energy Laboratory Co., Ltd., Atsugi (JP)

(72) Inventors: Shunpei Yamazaki, Setagaya (JP); Daisuke Matsubayashi, Atsugi (JP); Keisuke Murayama, Chigasaki (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 17/065,635

(22) Filed: Oct. 8, 2020

(65) Prior Publication Data
US 2021/0036159 A1 Feb. 4, 2021

Related U.S. Application Data

(63) Continuation of application No. 16/707,432, filed on Dec. 9, 2019, now Pat. No. 10,872,981, which is a (Continued)

(30) Foreign Application Priority Data

Apr. 13, 2012 (JP) .................................. 2012-091539

(51) Int. Cl.
*H01L 29/78* (2006.01)
*H01L 29/786* (2006.01)

(52) U.S. Cl.
CPC ...... *H01L 29/7869* (2013.01); *H01L 29/7831* (2013.01)

(58) Field of Classification Search
CPC . H01L 29/7869; H01L 29/7831; H01L 21/16; H01L 21/00; H01L 29/24; H01L 21/479
(Continued)

(56) References Cited

U.S. PATENT DOCUMENTS 5,731,856 A 3/1998 Kim et al.
5,744,864 A 4/1998 Cillessen et al.
(Continued)

FOREIGN PATENT DOCUMENTS

CN 101617408 A 12/2009
CN 101630692 A 1/2010
(Continued)

OTHER PUBLICATIONS

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.
(Continued)

*Primary Examiner* — Didarul A Mazumder
(74) *Attorney, Agent, or Firm* — Robinson Intellectual Property Law Office; Eric J. Robinson

(57) ABSTRACT

A transistor includes oxide semiconductor stacked layers between a first gate electrode layer and a second gate electrode layer through an insulating layer interposed between the first gate electrode layer and the oxide semiconductor stacked layers and an insulating layer interposed between the second gate electrode layer and the oxide semiconductor stacked layers. The thickness of a channel formation region is smaller than the other regions in the oxide semiconductor stacked layers. Further in this transistor, one of the gate electrode layers is provided as what is called a back gate for controlling the threshold voltage. Controlling the potential applied to the back gate enables control of the threshold voltage of the transistor, which makes it easy to maintain the normally-off characteristics of the transistor.

19 Claims, 13 Drawing Sheets

Related U.S. Application Data continuation of application No. 16/180,210, filed on Nov. 5, 2018, now Pat. No. 10,559,699, which is a continuation of application No. 15/262,547, filed on Sep. 12, 2016, now Pat. No. 10,158,026, which is a continuation of application No. 14/594,991, filed on Jan. 12, 2015, now Pat. No. 9,472,679, which is a continuation of application No. 13/860,792, filed on Apr. 11, 2013, now Pat. No. 8,946,702.

(58) Field of Classification Search
USPC .................. 257/43; 438/85, 86, 104, 754
See application file for complete search history.

(56) References Cited

U.S. PATENT DOCUMENTS

| | | |
|---|---|---|
| 6,207,969 B1 | 3/2001 | Yamazaki |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 6,838,308 B2 | 1/2005 | Haga |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,382,421 B2 | 6/2008 | Hoffman et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,576,394 B2 | 8/2009 | Furuta et al. |
| 7,601,984 B2 | 10/2009 | Sano et al. |
| 7,642,038 B2 | 1/2010 | Fujii |
| 7,674,650 B2 | 3/2010 | Akimoto et al. |
| 7,732,819 B2 | 6/2010 | Akimoto et al. |
| 7,791,072 B2 | 9/2010 | Kumomi et al. |
| 7,855,379 B2 | 12/2010 | Hayashi et al. |
| 7,935,964 B2 | 5/2011 | Kim et al. |
| 7,994,500 B2 | 8/2011 | Kim et al. |
| 8,058,645 B2 | 11/2011 | Jeong et al. |
| 8,067,775 B2 | 11/2011 | Miyairi et al. |
| 8,088,652 B2 | 1/2012 | Hayashi et al. |
| 8,106,400 B2 | 1/2012 | Miyairi et al. |
| 8,148,779 B2 | 4/2012 | Jeong et al. |
| 8,178,884 B2 | 5/2012 | Ha et al. |
| 8,188,480 B2 | 5/2012 | Itai |
| 8,202,365 B2 | 6/2012 | Umeda et al. |
| 8,203,143 B2 | 6/2012 | Imai |
| 8,222,092 B2 | 7/2012 | Yamazaki et al. |
| 8,232,551 B2 | 7/2012 | Kim et al. |
| 8,232,552 B2 | 7/2012 | Yano et al. |
| 8,274,078 B2 | 9/2012 | Itagaki et al. |
| 8,309,961 B2 | 11/2012 | Yamazaki et al. |
| 8,344,387 B2 | 1/2013 | Akimoto et al. |
| 8,362,478 B2 | 1/2013 | Yamazaki et al. |
| 8,377,744 B2 | 2/2013 | Yamazaki et al. |
| 8,384,076 B2 | 2/2013 | Park et al. |
| 8,426,868 B2 | 4/2013 | Akimoto et al. |
| 8,450,732 B2 | 5/2013 | Kim et al. |
| 8,497,502 B2 | 7/2013 | Yaegashi |
| 8,507,907 B2 | 8/2013 | Takahashi et al. |
| 8,546,811 B2 | 10/2013 | Godo et al. |
| 8,582,349 B2 | 11/2013 | Yamazaki et al. |
| 8,618,537 B2 | 12/2013 | Kaneko et al. |
| 8,633,492 B2 | 1/2014 | Akimoto et al. |
| 8,659,013 B2 | 2/2014 | Yamazaki |
| 8,664,036 B2 | 3/2014 | Yamazaki et al. |
| 8,674,979 B2 | 3/2014 | Hayakawa |
| 8,692,252 B2 | 4/2014 | Takata et al. |
| 8,704,216 B2 | 4/2014 | Godo et al. |
| 8,748,881 B2 | 6/2014 | Yamazaki |
| 8,748,886 B2 | 6/2014 | Yamazaki et al. |
| 8,759,167 B2 | 6/2014 | Akimoto et al. |
| 8,779,420 B2 | 7/2014 | Yamazaki |
| 8,841,163 B2 | 9/2014 | Yamazaki et al. |
| 8,853,690 B2 | 10/2014 | Yamazaki et al. |
| 8,883,555 B2 | 11/2014 | Yamazaki |
| 8,946,702 B2 | 2/2015 | Yamazaki et al. |
| 8,952,377 B2 | 2/2015 | Yamazaki et al. |
| 8,957,414 B2 | 2/2015 | Yamazaki et al. |
| 9,059,047 B2 | 6/2015 | Yamazaki |
| 9,064,899 B2 | 6/2015 | Godo et al. |
| 9,130,049 B2 | 9/2015 | Sano et al. |
| 9,190,528 B2 | 11/2015 | Yamazaki et al. |
| 9,214,520 B2 | 12/2015 | Yamazaki |
| 9,224,609 B2 | 12/2015 | Yamazaki et al. |
| 9,240,467 B2 | 1/2016 | Yamazaki et al. |
| 9,257,082 B2 | 2/2016 | Kimura et al. |
| 9,391,095 B2 | 7/2016 | Yamazaki et al. |
| 9,391,209 B2 | 7/2016 | Godo et al. |
| 9,406,808 B2 | 8/2016 | Yamazaki et al. |
| 9,431,429 B2 | 8/2016 | Yamazaki |
| 9,472,679 B2 | 10/2016 | Yamazaki et al. |
| 9,583,637 B2 | 2/2017 | Sano et al. |
| 9,640,668 B2 | 5/2017 | Yamazaki |
| 9,660,102 B2 | 5/2017 | Godo et al. |
| 9,721,811 B2 | 8/2017 | Yamazaki et al. |
| 10,109,500 B2 | 10/2018 | Yamazaki et al. |
| 10,134,912 B2 | 11/2018 | Kimura et al. |
| 10,559,699 B2 | 2/2020 | Yamazaki et al. |
| 10,700,215 B2 | 6/2020 | Kimura et al. |
| 11,069,817 B2 | 7/2021 | Kimura et al. |
| 2001/0046027 A1 | 11/2001 | Tai et al. |
| 2002/0056838 A1 | 5/2002 | Ogawa |
| 2002/0075423 A1 | 6/2002 | Fujino |
| 2002/0132454 A1 | 9/2002 | Ohtsu et al. |
| 2003/0189401 A1 | 10/2003 | Kido et al. |
| 2003/0218222 A1 | 11/2003 | Wager, II et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2005/0221203 A1 | 10/2005 | Fujii |
| 2005/0275038 A1 | 12/2005 | Shih et al. |
| 2006/0035452 A1 | 2/2006 | Carcia et al. |
| 2006/0043377 A1 | 3/2006 | Hoffman et al. |
| 2006/0043447 A1 | 3/2006 | Ishii et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0072439 A1 | 3/2007 | Akimoto et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |

(56) References Cited

U.S. PATENT DOCUMENTS

| | | |
|---|---|---|
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0191204 A1 | 8/2008 | Kim et al. |
| 2008/0224133 A1 | 9/2008 | Park et al. |
| 2008/0237598 A1 | 10/2008 | Nakayama |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0291350 A1 | 11/2008 | Hayashi et al. |
| 2008/0296568 A1 | 12/2008 | Ryu et al. |
| 2008/0308796 A1 | 12/2008 | Akimoto et al. |
| 2008/0308797 A1 | 12/2008 | Akimoto et al. |
| 2008/0308804 A1 | 12/2008 | Akimoto et al. |
| 2008/0308805 A1 | 12/2008 | Akimoto et al. |
| 2008/0308806 A1 | 12/2008 | Akimoto et al. |
| 2009/0008639 A1 | 1/2009 | Akimoto et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0127551 A1 | 5/2009 | Imai |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0179199 A1 | 7/2009 | Sano et al. |
| 2009/0189153 A1 | 7/2009 | Iwasaki et al. |
| 2009/0218572 A1 | 9/2009 | Dairiki et al. |
| 2009/0236596 A1 | 9/2009 | Itai |
| 2009/0239335 A1 | 9/2009 | Akimoto et al. |
| 2009/0250693 A1 | 10/2009 | Jeong et al. |
| 2009/0261325 A1 | 10/2009 | Kawamura et al. |
| 2009/0269881 A1 | 10/2009 | Furuta et al. |
| 2009/0278122 A1 | 11/2009 | Hosono et al. |
| 2009/0280600 A1 | 11/2009 | Hosono et al. |
| 2009/0305461 A1 | 12/2009 | Akimoto et al. |
| 2009/0321731 A1 | 12/2009 | Jeong et al. |
| 2009/0321732 A1 | 12/2009 | Kim et al. |
| 2009/0321743 A1 | 12/2009 | Isa et al. |
| 2010/0006833 A1 | 1/2010 | Ha et al. |
| 2010/0025678 A1 | 2/2010 | Yamazaki et al. |
| 2010/0032665 A1 | 2/2010 | Yamazaki et al. |
| 2010/0038641 A1 | 2/2010 | Imai |
| 2010/0044701 A1 | 2/2010 | Sano et al. |
| 2010/0051938 A1 | 3/2010 | Hayashi et al. |
| 2010/0051943 A1 | 3/2010 | Fujii |
| 2010/0051949 A1 | 3/2010 | Yamazaki et al. |
| 2010/0065844 A1 | 3/2010 | Tokunaga |
| 2010/0078633 A1 | 4/2010 | Watanabe |
| 2010/0084648 A1 | 4/2010 | Watanabe |
| 2010/0092800 A1 | 4/2010 | Itagaki et al. |
| 2010/0102313 A1 | 4/2010 | Miyairi et al. |
| 2010/0109002 A1 | 5/2010 | Itagaki et al. |
| 2010/0117999 A1 | 5/2010 | Matsunaga et al. |
| 2010/0136743 A1 | 6/2010 | Akimoto et al. |
| 2010/0140612 A1 | 6/2010 | Omura et al. |
| 2010/0148170 A1 | 6/2010 | Ueda et al. |
| 2010/0155717 A1 | 6/2010 | Yano et al. |
| 2010/0163866 A1 | 7/2010 | Akimoto et al. |
| 2010/0163868 A1 | 7/2010 | Yamazaki et al. |
| 2010/0181565 A1 | 7/2010 | Sakata et al. |
| 2010/0244029 A1 | 9/2010 | Yamazaki et al. |
| 2010/0283049 A1 | 11/2010 | Sato et al. |
| 2010/0320458 A1 | 12/2010 | Umeda et al. |
| 2010/0320459 A1 | 12/2010 | Umeda et al. |
| 2011/0006301 A1 | 1/2011 | Yamazaki et al. |
| 2011/0024740 A1 | 2/2011 | Yamazaki et al. |
| 2011/0024750 A1 | 2/2011 | Yamazaki et al. |
| 2011/0024751 A1 | 2/2011 | Yamazaki et al. |
| 2011/0031491 A1 | 2/2011 | Yamazaki et al. |
| 2011/0037068 A1 | 2/2011 | Yamazaki et al. |
| 2011/0062436 A1 | 3/2011 | Yamazaki et al. |
| 2011/0068335 A1 | 3/2011 | Yamazaki et al. |
| 2011/0089414 A1 | 4/2011 | Yamazaki et al. |
| 2011/0101331 A1 | 5/2011 | Yamazaki et al. |
| 2011/0108837 A1 | 5/2011 | Yamazaki et al. |
| 2011/0109351 A1 | 5/2011 | Yamazaki et al. |
| 2011/0127521 A1 | 6/2011 | Yamazaki |
| 2011/0127522 A1 | 6/2011 | Yamazaki |
| 2011/0127523 A1 | 6/2011 | Yamazaki |
| 2011/0133191 A1* | 6/2011 | Yamazaki ............ H01L 29/045 257/57 |
| 2011/0136301 A1 | 6/2011 | Yamazaki et al. |
| 2011/0136302 A1 | 6/2011 | Yamazaki et al. |
| 2011/0140100 A1 | 6/2011 | Takata et al. |
| 2011/0151618 A1 | 6/2011 | Yamazaki et al. |
| 2011/0156026 A1 | 6/2011 | Yamazaki et al. |
| 2011/0175082 A1 | 7/2011 | Kim et al. |
| 2011/0175101 A1 | 7/2011 | Hatano et al. |
| 2011/0193083 A1 | 8/2011 | Kim et al. |
| 2011/0207269 A1 | 8/2011 | Sasagawa et al. |
| 2011/0210328 A1 | 9/2011 | Yamazaki et al. |
| 2011/0212571 A1 | 9/2011 | Yamazaki et al. |
| 2011/0215318 A1 | 9/2011 | Yamazaki et al. |
| 2011/0215319 A1 | 9/2011 | Yamazaki et al. |
| 2011/0215328 A1 | 9/2011 | Morosawa et al. |
| 2011/0240462 A1 | 10/2011 | Yamazaki |
| 2011/0240992 A1 | 10/2011 | Yamazaki |
| 2012/0033152 A1 | 2/2012 | Ha et al. |
| 2012/0049183 A1 | 3/2012 | Yamazaki |
| 2012/0051119 A1 | 3/2012 | Yamazaki et al. |
| 2012/0061668 A1 | 3/2012 | Miyairi et al. |
| 2012/0119205 A1 | 5/2012 | Taniguchi et al. |
| 2012/0132903 A1* | 5/2012 | Yamazaki ......... H01L 21/02502 257/43 |
| 2012/0153278 A1 | 6/2012 | Jeong et al. |
| 2012/0161139 A1 | 6/2012 | Endo et al. |
| 2012/0175608 A1 | 7/2012 | Yamazaki |
| 2012/0187395 A1 | 7/2012 | Koezuka |
| 2012/0220077 A1 | 8/2012 | Ha et al. |
| 2012/0256179 A1 | 10/2012 | Yamazaki et al. |
| 2012/0261664 A1 | 10/2012 | Saito |
| 2012/0280227 A1 | 11/2012 | Wakana et al. |
| 2012/0305912 A1 | 12/2012 | Koyama et al. |
| 2012/0319102 A1 | 12/2012 | Yamazaki et al. |
| 2012/0319114 A1 | 12/2012 | Yamazaki et al. |
| 2012/0319183 A1 | 12/2012 | Yamazaki et al. |
| 2013/0009209 A1 | 1/2013 | Yamazaki |
| 2013/0009220 A1 | 1/2013 | Yamazaki et al. |
| 2013/0020571 A1 | 1/2013 | Yamazaki et al. |
| 2013/0082262 A1 | 4/2013 | Honda et al. |
| 2013/0161608 A1 | 6/2013 | Yamazaki |
| 2013/0240873 A1 | 9/2013 | Yamazaki et al. |
| 2013/0264563 A1 | 10/2013 | Okazaki et al. |
| 2013/0270549 A1 | 10/2013 | Okazaki et al. |
| 2013/0270563 A1 | 10/2013 | Yamazaki |
| 2014/0070211 A1 | 3/2014 | Iwasaki et al. |
| 2014/0246673 A1 | 9/2014 | Akimoto et al. |
| 2016/0336456 A1 | 11/2016 | Yamazaki et al. |
| 2016/0351597 A1 | 12/2016 | Yamazaki |
| 2017/0069765 A1 | 3/2017 | Yamazaki et al. |
| 2021/0343877 A1 | 11/2021 | Kimura et al. |

FOREIGN PATENT DOCUMENTS

| | | |
|---|---|---|
| CN | 101752428 A | 6/2010 |
| CN | 101853884 A | 10/2010 |
| CN | 102197490 A | 9/2011 |
| CN | 102386236 A | 3/2012 |
| CN | 102403361 A | 4/2012 |

(56) References Cited

FOREIGN PATENT DOCUMENTS

| | | |
|---|---|---|
| CN | 102509736 A | 6/2012 |
| CN | 102640272 A | 8/2012 |
| CN | 102648526 A | 8/2012 |
| EP | 1737044 A | 12/2006 |
| EP | 2105967 A | 9/2009 |
| EP | 2120267 A | 11/2009 |
| EP | 2141743 A | 1/2010 |
| EP | 2144294 A | 1/2010 |
| EP | 2146379 A | 1/2010 |
| EP | 2149910 A | 2/2010 |
| EP | 2149911 A | 2/2010 |
| EP | 2197034 A | 6/2010 |
| EP | 2226847 A | 9/2010 |
| EP | 2408011 A | 1/2012 |
| EP | 2423966 A | 2/2012 |
| EP | 2544237 A | 1/2013 |
| EP | 2927965 A | 10/2015 |
| GB | 2153589 | 8/1985 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165528 A | 6/2006 |
| JP | 2006-165529 A | 6/2006 |
| JP | 2007-096055 A | 4/2007 |
| JP | 2007-123861 A | 5/2007 |
| JP | 2007-150158 A | 6/2007 |
| JP | 2007-281409 A | 10/2007 |
| JP | 2008-243928 A | 10/2008 |
| JP | 2008-276212 A | 11/2008 |
| JP | 2008-294136 A | 12/2008 |
| JP | 2009-231613 A | 10/2009 |
| JP | 2009-278115 A | 11/2009 |
| JP | 2010-016347 A | 1/2010 |
| JP | 2010-016348 A | 1/2010 |
| JP | 2010-021520 A | 1/2010 |
| JP | 2010-034534 A | 2/2010 |
| JP | 2010-040552 A | 2/2010 |
| JP | 4415062 | 2/2010 |
| JP | 2010-067954 A | 3/2010 |
| JP | 2010-073881 A | 4/2010 |
| JP | 2010-087223 A | 4/2010 |
| JP | 2010-123938 A | 6/2010 |
| JP | 2010-135766 A | 6/2010 |
| JP | 2010-177431 A | 8/2010 |
| JP | 2010-186860 A | 8/2010 |
| JP | 2010-186994 A | 8/2010 |
| JP | 2010-531059 | 9/2010 |
| JP | 2010-226101 A | 10/2010 |
| JP | 4571221 | 10/2010 |
| JP | 2010-251735 A | 11/2010 |
| JP | 2010-267955 A | 11/2010 |
| JP | 2011-035387 A | 2/2011 |
| JP | 2011-076079 A | 4/2011 |
| JP | 2011-086923 A | 4/2011 |
| JP | 2011-100997 A | 5/2011 |
| JP | 2011-120221 A | 6/2011 |
| JP | 2011-124360 A | 6/2011 |
| JP | 2011-135063 A | 7/2011 |
| JP | 2011-135066 A | 7/2011 |
| JP | 2011-138934 A | 7/2011 |
| JP | 2011-139050 A | 7/2011 |
| JP | 2011-139051 A | 7/2011 |
| JP | 2011-139054 A | 7/2011 |
| JP | 2011-146697 A | 7/2011 |
| JP | 2011-176294 A | 9/2011 |
| JP | 2011-181917 A | 9/2011 |
| JP | 2011-192973 A | 9/2011 |
| JP | 2011-228688 A | 11/2011 |
| JP | 2011-233876 A | 11/2011 |
| JP | 2011-243745 A | 12/2011 |
| JP | 2012-028731 A | 2/2012 |
| JP | 2012-059860 A | 3/2012 |
| JP | 2012-060160 A | 3/2012 |
| JP | 2012-067387 A | 4/2012 |
| JP | 2012-069231 A | 4/2012 |
| JP | 2012-160679 A | 8/2012 |
| JP | 2012-160717 A | 8/2012 |
| KR | 2008-0058406 A | 6/2008 |
| KR | 2010-0108291 A | 10/2010 |
| KR | 2011-0073616 A | 6/2011 |
| KR | 2011-0095830 A | 8/2011 |
| KR | 2011-0107934 A | 10/2011 |
| KR | 2011-0111542 A | 10/2011 |
| KR | 2012-0005055 A | 1/2012 |
| KR | 2012-0026005 A | 3/2012 |
| KR | 2012-0099475 A | 9/2012 |
| KR | 2012-0103616 A | 9/2012 |
| KR | 2012-0104572 A | 9/2012 |
| TW | 200901481 | 1/2009 |
| TW | 201131664 | 9/2011 |
| TW | 201138111 | 11/2011 |
| TW | 201222823 | 6/2012 |
| WO | WO-2004/114391 | 12/2004 |
| WO | WO-2007/032294 | 3/2007 |
| WO | WO-2008/105347 | 9/2008 |
| WO | WO-2008/126884 | 10/2008 |
| WO | WO-2008/133345 | 11/2008 |
| WO | WO-2008/156311 | 12/2008 |
| WO | WO-2008/156312 | 12/2008 |
| WO | WO-2009/034953 | 3/2009 |
| WO | WO-2009/072532 | 6/2009 |
| WO | WO-2010/093051 | 8/2010 |
| WO | WO-2011/033936 | 3/2011 |
| WO | WO-2011/043203 | 4/2011 |
| WO | WO-2011/052368 | 5/2011 |
| WO | WO-2011/065243 | 6/2011 |
| WO | WO-2011/065329 | 6/2011 |
| WO | WO-2011/068033 | 6/2011 |
| WO | WO-2011/068037 | 6/2011 |
| WO | WO-2011/074409 | 6/2011 |
| WO | WO-2011/093003 | 8/2011 |
| WO | WO-2011/096275 | 8/2011 |
| WO | WO-2011/125454 | 10/2011 |

OTHER PUBLICATIONS

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.

(56) References Cited

OTHER PUBLICATIONS

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Tsuda.K et al., "Ultra Low Power Consumption Technologies for Mobile TFT-LCDs", IDW '02 : Proceedings of the 9th International Display Workshops, Dec. 4, 2002, pp. 295-298.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems", Journal of Solid-State Circuits, 2008, vol. 43, No. 1, pp. 292-299.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back Plane", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn-Oxide TFTS", IDW '09 : Proceedings of the 16th International Display Workshops, 2009, pp. 689-692.

Park.J et al., "Amorphous Indium-Gallium-Zinc Oxide TFTS and Their Application for Large Size AMOLED", AM-FPD '08 Digest of Technical Papers, Jul. 2, 2008, pp. 275-278.

Park.S et al., "Challenge to Future Displays: Transparent AMOLED Driven by PEALD Grown ZnO TFT", IMID '07 Digest, 2007, pp. 1249-1252.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Hirao.T et al., "Novel Top-Gate Zinc Oxide Thin-Film Transistors (ZnO TFTS) for AMLCDS", J. Soc. Inf. Display (Journal of the Society for Information Display), 2007, vol. 15, No. 1, pp. 17 22.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Godo.H et al., "p. 9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Ohara.H et al., "21.3:4.0 In. QVGA AMOLED Display Using In—Ga—Zn-Oxide TFTS With a Novel Passivation Layer", SID Digest '09 : SID International Symposium Digest of Technical Papers, May 31, 2009, pp. 284-287.

Miyasaka.M, "SUFTLA Flexible Microelectronics on Their Way to Business", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Lee.H et al., "Current Status of, Challenges to, and Perspective View of AM-OLED", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Dis-

(56) References Cited

OTHER PUBLICATIONS play Application", SID Digest '07 : SID International Symposium Digest of Technical Papers, 2007, vol. 38, pp. 1737-1740.
Nakamura.M, "Synthesis of Homologous Compound with New Long-Period Structure", Nirim Newsletter, Mar. 1, 1995, vol. 150, pp. 1-4.
Kikuchi.H et al., "Polymer-Stabilized Liquid Crystal Blue Phases", Nature Materials, Sep. 2, 2002, vol. 1, pp. 64-68.
Kimizuka.N et al., "SPINEL,YbFe2O4, and Yb2Fe3O7 Types of Structures for Compounds in the In2O3 and Sc2O3-A2O3-BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.
Kitzerow.H et al., "Observation of Blue Phases in Chiral Networks", Liquid Crystals, 1993, vol. 14, No. 3, pp. 911-916.
Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Park.S et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.
Janotti.A et al., "Native Point Defects in ZnO", Phys. Rev. B (Physical Review. B), Oct. 4, 2007, vol. 76, No. 16, pp. 165202-1-165202-22.
Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.
Hsieh.H et al., "p. 29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Janotti.A et al., "Oxygen Vacancies in ZnO", Appl. Phys. Lett. (Applied Physics Letters), 2005, vol. 87, pp. 122102-1-122102-3.
Oba.F et al., "Defect energetics in ZnO: A hybrid Hartree-Fock density functional study", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor", Philosophical Magazine, 2001, vol. 81, No. 5, pp. 501-515.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Mo.Y et al., "Amorphous Oxide TFT Backplanes for Large Size AMOLED Displays", IDW '08 : Proceedings of the 6th International Display Workshops, Dec. 3, 2008, pp. 581-584.
Kim.S et al., "High-Performance oxide thin film transistors passivated by various gas plasmas", 214th ECS Meeting, 2008, No. 2317, ECS.
Clark.S et al., "First Principles Methods Using CASTEP", Zeitschrift fur Kristallographie, 2005, vol. 220, pp. 567-570.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.
Nakayama.M et al., "17a-TL-8 Effect of GaO Layer on IGZO-TFT Channel", Extended Abstracts (The 57th Spring Meeting 2010), The Japan Society of Applied Physics and Related Societies, Mar. 17, 2010, pp. 21-008.
Morosawa.N et al., "35.3: Distinguished Paper: A Novel Self-Aligned Top-Gate Oxide TFT for AM-OLED Displays", SID Digest '11 : SID International Symposium Digest of Technical Papers, May 17, 2011, pp. 479-482.
Nathan.A et al., "Amorphous Oxide TFTs: Progress and Issues", SID Digest '12 : SID International Symposium Digest of Technical Papers, Jun. 5, 2012, vol. 43, No. 1, pp. 1-4.
Jeon.S et al., "Low-Frequency Noise Performance of a Bilayer InZnO_InGaZnO Thin-Film Transistor for Analog Device Applications", IEEE Electron Device Letters, Oct. 1, 2010, vol. 31, No. 10, pp. 1128-1130.
Ono.M et al., "Novel High Performance IGZO-TFT with High Mobility over 40 cm2/Vs and High Photostability Incorporated Oxygen Diffusion", IDW '11 : Proceedings of the 18th International Display Workshops, Dec. 7, 2011, pp. 1689-1690.
Ghaffarzadeh.K et al., "Light-Bias Induced Instability and Persistent Photoconductivity in In—Zn—O/Ga—In—Zn—O Thin Film Transistors", SID Digest '11 : SID International Symposium Digest of Technical Papers, Jun. 1, 2011, vol. 42, No. 1, pp. 1154-1157.

\* cited by examiner

SEMICONDUCTOR DEVICE COMPRISING STACKED OXIDE SEMICONDUCTOR LAYERS

TECHNICAL FIELD

The invention disclosed in this specification relates to a semiconductor device and a method for manufacturing the semiconductor device.

In this specification and the like, a semiconductor device refers to all types of devices that can function by utilizing semiconductor characteristics; an electro-optical device, a light-emitting display device, a semiconductor circuit, and an electronic device are all semiconductor devices.

BACKGROUND ART

A technique for forming a transistor by using a semiconductor thin film formed over a substrate having an insulating surface has attracted attention. Such a transistor is applied to a wide range of semiconductor electronic devices such as an integrated circuit (IC) and an image display device (also simply referred to as display device). A silicon-based semiconductor material is widely known as a material for a semiconductor thin film applicable to the transistor. As another material, an oxide semiconductor has been attracting attention.

For example, a technique is disclosed by which a transistor is manufactured using zinc oxide or an In—Ga—Zn-based oxide as an oxide semiconductor (see Patent Documents 1 and 2).

REFERENCE

Patent Document

[Patent Document 1] Japanese Published Patent Application No. 2007-123861

[Patent Document 2] Japanese Published Patent Application No. 2007-096055

DISCLOSURE OF INVENTION

In a transistor used in a semiconductor device, it is preferable that a channel be formed at a positive threshold voltage ($V_{th}$) which is as close to 0 V as possible. A transistor having a negative threshold voltage tends to be what is called a normally-on transistor that passes a current between a source and a drain even at a gate voltage of 0 V, and a circuit including such a transistor is difficult to control. For this reason, the transistor having the negative threshold voltage is not suited for the use in an integrated circuit of a semiconductor device.

In view of the above, an object of one embodiment of the present invention is to provide a structure of an n-channel transistor including an oxide semiconductor in its channel formation region which has a positive threshold voltage, that is, which enables a normally-off switching element, and to provide a method for forming the structure.

Further, it is important to make transistor characteristics close to the normally-off characteristics even when the transistor cannot become a normally-off transistor due to the material or the manufacturing condition. Thus, another object of one embodiment of the present invention is to provide a structure of a transistor which enables a threshold voltage close to zero even when the threshold voltage is negative, that is, even when the transistor is a normally-on transistor, and to provide a method for forming the structure.

Note that one embodiment of the present invention achieves at least one of the above objects.

In one embodiment of the present invention, a transistor includes oxide semiconductor stacked layers between a first gate electrode layer and a second gate electrode layer through an insulating layer interposed between the first gate electrode layer and the oxide semiconductor stacked layers and an insulating layer interposed between the second gate electrode layer and the oxide semiconductor stacked layers, and the thickness of a channel formation region is smaller than the other regions in the oxide semiconductor stacked layers. Further in this transistor, one of the gate electrode layers is provided as what is called a back gate for controlling the threshold voltage. Controlling the potential applied to the back gate enables control of the threshold voltage of the transistor, which makes it easy to maintain the normally-off characteristics of the transistor. More specifically, the following structures can be employed, for example.

One embodiment of the present invention is a semiconductor device which includes a first gate electrode layer over an insulating surface, a first insulating layer over the first gate electrode layer, oxide semiconductor stacked layers including a first oxide semiconductor layer and a second oxide semiconductor layer and overlapping with the first gate electrode layer with the first insulating layer interposed between the first gate electrode layer and the oxide semiconductor stacked layers, a source electrode layer and a drain electrode layer over and in contact with the second oxide semiconductor layer, a second insulating layer over and in contact with the source electrode layer, the drain electrode layer, and part of the oxide semiconductor stacked layers, and a second gate electrode layer overlapping with the oxide semiconductor stacked layers with the second insulating layer interposed therebetween. In the oxide semiconductor stacked layers, a region in contact with the second insulating layer has a smaller thickness than a region in contact with the source electrode layer and a region in contact with the drain electrode layer.

Another embodiment of the present invention is a semiconductor device which includes a first gate electrode layer over an insulating surface, a first insulating layer over the first gate electrode layer, oxide semiconductor stacked layers including a first oxide semiconductor layer and a second oxide semiconductor layer and overlapping with the first gate electrode layer with the first insulating layer interposed between the first gate electrode layer and the oxide semiconductor stacked layers, a source electrode layer and a drain electrode layer over and in contact with the second oxide semiconductor layer, a second insulating layer over and in contact with the source electrode layer, the drain electrode layer, and part of the oxide semiconductor stacked layers, and a second gate electrode layer overlapping with the oxide semiconductor stacked layers with the second insulating layer interposed therebetween. In the semiconductor device, the first oxide semiconductor layer and the second oxide semiconductor layer have the same constituent elements and different compositions of the constituent elements. Further, in the oxide semiconductor stacked layers, a region in contact with the second insulating layer has a smaller thickness than a region in contact with the source electrode layer and a region in contact with the drain electrode layer.

In the above-described semiconductor devices, it is preferable that the first oxide semiconductor layer include at least indium and gallium, and that an indium content be higher than a gallium content in the first oxide semiconductor layer.

Further in the above-described semiconductor devices, it is preferable that the second oxide semiconductor layer include at least indium and gallium, and that an indium content be lower than or equal to a gallium content in the second oxide semiconductor layer.

Further in the above-described semiconductor devices, it is preferable that at least one of the first gate electrode layer and the second gate electrode layer be a conductive layer having a work function of 5 electron volts or more. For example, at least one of the first gate electrode layer and the second gate electrode layer is preferably an In—Ga—Zn—O film including nitrogen.

The effect of the above-described structures of embodiments of the invention disclosed herein can be explained as follows. Note that the following description is merely one consideration.

A transistor using an oxide semiconductor can be regarded as an accumulation-mode n-channel MOSFET using electrons which are its majority carriers. In an n-channel inversion-mode MOSFET using silicon, an inversion layer is formed in the vicinity of a surface of an active layer (silicon here) by application of a gate voltage, thereby forming a channel. Meanwhile in the accumulation-mode MOSFET, a channel through which a current flows is formed by accumulation of electrons, which are majority carriers, in the vicinity of a surface of an active layer (an oxide semiconductor layer here) in an on state. Further, in an off state, the entire active layer is completely depleted by being applied with a negative gate voltage.

As the on-state current in the accumulation-mode MOSFET, there exist a first current that flows in the vicinity of the surface (accumulation) and a second current that flows through the entire region in the film thickness direction in the active layer. This is largely different from the inversion-mode MOSFET. Here, assuming that the threshold voltage of the first current is $V_{th\_1}$ and the threshold voltage of the second current is $V_{th\_2}$, when the gate voltage $V_g$ is lower than the threshold voltage of the second current ($V_g < V_{th\_2}$), the entire region in the film thickness direction in the active layer is depleted (completely depleted) and the transistor is in an off state. When the gate voltage $V_g$ is increased to be higher than the threshold voltage $V_{th\_2}$ of the second current and lower than the threshold voltage $V_{th\_1}$ of the first current ($V_{th\_2} < V_g < V_{th\_1}$), the width of the depletion layer decreases (partly depleted state), and the second current flows on the back channel side; thus, the transistor is in an on state. When the gate voltage $V_g$ is further increased to be a voltage exceeding the threshold voltage of the first current ($V_{th\_1} < V_g$), the depletion layer disappears and carriers (electrons) are accumulated in the vicinity of the surface of the active layer; thus, the first current flows.

The threshold voltage $V_{th\_2}$ of the second current and the threshold voltage $V_{th\_1}$ of the first current in the accumulation-mode n-channel MOSFET are expressed by Equation 1 and Equation 2 using gradual channel approximation.

$$V_{th\_2} = V_{FB} - \left(1 + 2\frac{C_S}{C_{ox}}\right)\frac{eN_d t_S^2}{2\varepsilon_S} \quad \text{[Equation 1]}$$

$$= V_{FB} - \left(\frac{C_{ox}}{C_S} + 2\right)\frac{eN_d t_S}{2C_{ox}}$$

$$V_{th\_1} = V_{FB} \quad \text{[Equation 2]}$$

In Equations 1 and 2, $V_{FB}$ is a flat band voltage, $C_s$ is a capacitance of the active layer, $C_{ox}$ is a capacitance of a gate insulating layer, $N_d$ is a donor density, and $t_s$ is a thickness of the active layer.

According to Equation 1, increase in the donor density ($N_d$) and the thickness ($t_s$) of the active layer moves (shifts) the threshold voltage $V_{th\_2}$ of the second current in the negative direction. Further, according to Equation 1 and Equation 2, increase in the flat band voltage ($V_{FB}$), that is, increase in the work function of a gate electrode layer is important in shifting the threshold voltages ($V_{th\_1}$ and $V_{th\_2}$) of the accumulation-mode n-channel MOSFET in the positive direction.

Next, dependence of electric characteristics of a transistor that uses an oxide semiconductor on the thickness ($T_{OS}$) of an oxide semiconductor layer and the donor density ($N_d$) was calculated with a device simulator.

The transistor structure assumed in the calculation is shown in FIG. 9. Further, calculation conditions are shown in Table 1.

This calculation used a transistor 320 illustrated in FIG. 9, which includes an oxide semiconductor layer 306 formed over an insulating layer 302 with a thickness of 300 nm, a source electrode layer 308a and a drain electrode layer 308b over the oxide semiconductor layer 306, a gate insulating layer 310 that covers the source electrode layer 308a and the drain electrode layer 308b and is partly in contact with the oxide semiconductor layer 306, and a gate electrode layer 112 that overlaps with the oxide semiconductor layer 306 with the gate insulating layer 310 sandwiched therebetween.

TABLE 1

| | | |
|---|---|---|
| Channel length (L)/Channel width (W) | | 1/1 [um] |
| Thickness (Tox) of gate insulating layer/ Dielectric constant (ε) | | 10[nm]/22 |
| Thickness (Tos) of oxide semiconductor layer | | 10, 20, 30, 40, 50 [nm] |
| Thickness of source electrode layer or drain electrode layer/Work function | | 50[nm]/4.6[eV] |
| Work function of gate electrode layer | | 5.0 [eV] |
| Parameters of oxide semiconductor layer | Band gap ($E_g$) | 3.15 [eV] |
| | Electron affinity ($\chi$) | 4.6 [eV] |
| | Dielectric constant (ε) | 15 |
| | Electron mobility ($\mu n$) | 20 [cm$^2$/Vs] |
| | Hole mobility ($\mu p$) | 0.1 [cm$^2$/Vs] |
| | Nc | 5E18 [cm$^{-3}$] |
| | Nv | 5E18 [cm$^{-3}$] |
| Donor density (Nd) | | 1E16, 1E17, 1E18 [cm$^{-3}$] |

* Defect level and tunneling current are not assumed.
* No fixed charge at the interface on the gate insulating layer side.

The $I_d V_g$ characteristics ($V_d$=0.1 V) obtained by this calculation are shown in FIGS. 10A to 10C. FIGS. 10A to 10C show transistor characteristics based on the assumption that the density ($N_d$) of donors contained in the oxide semiconductor layer is 1×10$^{18}$ cm$^{-3}$ (FIG. 10A), 1×10$^{17}$ cm$^{-3}$ (FIG. 10B), and 1×10$^{16}$ cm$^{-3}$ (FIG. 10C).

In the case where the donor density ($N_d$) is high as shown in FIG. 10A, electric characteristics are favorable with a small thickness of the oxide semiconductor layer (e.g., 10 nm); however, normally-on characteristics are observed with larger thicknesses of the oxide semiconductor layer.

In the case where the donor density ($N_d$) is reduced to $1\times10^{17}$ cm$^{-3}$ as shown in FIG. 10B, the shift of the characteristics in the negative direction in accordance with the increase in the thickness of the oxide semiconductor layer is smaller. Moreover, the on-state current (Ion) is almost uniform without dependence on the thickness of the oxide semiconductor layer. Further, in the case where the donor density ($N_d$) is reduced to $1\times10^{16}$ cm$^{-3}$ as shown in FIG. 10C, almost no shift of characteristics in the negative direction in accordance with the increase in the thickness of the oxide semiconductor layer is seen.

From the above-described calculation results, the decrease in the thickness of the oxide semiconductor layer and the decrease in the density of donors contained in the oxide semiconductor layer are the keys to achieving a normally-off transistor.

A transistor described as one embodiment of the present invention includes oxide semiconductor stacked layers in which a channel formation region is thinner than the other region (e.g., a region in contact with the source electrode layer or the drain electrode layer). This can suppress the shift of the threshold voltage of the transistor in the negative direction.

Next, causes of the normally-on characteristics of the transistor are considered. In this consideration, the transistor with a thickness of the oxide semiconductor layer of 50 nm and a donor density of $1\times10^{18}$ cm$^{-3}$, which has characteristics shown in FIG. 10A, is used.

As described above, in the accumulation-mode MOSFET, there exist the first current that flows in the vicinity of the surface of the active layer (accumulation) and the second current that flows through the entire region in the film thickness direction in the active layer as the on-state current. It is known that the first current and the second current can be distinguished from each other by second-order differentiation of the $I_dV_g$ characteristics. The graph in FIG. 11A shows $I_dV_g$ characteristics (solid line) of the transistor with a thickness of the oxide semiconductor layer of 50 nm and a donor density of $1\times10^{18}$ cm$^{-3}$, and values obtained by the second-order differentiation (thick line).

In FIG. 11A, the line obtained by the second-order differentiation of the $I_dV_g$ characteristics has two peaks. This indicates that when the gate voltage ($V_g$) reaches the first peak ($V_g=-1.52$ V) by sweeping the gate voltage ($V_g$) in the positive direction from $-3$ V, the second current starts flowing and when it reaches the second peak ($V_g=0.30$ V), the first current starts flowing. These numerical results are almost consistent with the calculation results ($V_{th\_2}=-1.56$ V, $V_{th\_1}=0.36$ V) obtained by substituting the parameters in Table 1 into Equation 1 and Equation 2 which use gradual channel approximation.

Thus, it is effective to suppress the second current that flows at a low gate voltage rather than the first current, in order to achieve a normally-off transistor.

FIG. 11B shows current density distributions in a film thickness direction at several gate voltages. When a gate voltage $V_g$ of $-3$ V is applied, the transistor is in an off state and in a completely depleted state without electrons in the channel region. At the gate voltage $V_g$ higher than $V_{th\_2}$, the channel region is in a partly depleted state; at this time, the second current starts flowing on the back channel side. When $V_{th\_2}<V_g<V_{th\_1}$, the second current is dominant in the on-state current. When the gate voltage $V_g$ is higher than $V_{th\_1}$, the second current is not increased and the current density in the vicinity of the interface of the gate insulating layer is increased. At this time, the current density of the second current is about two orders of magnitude smaller than that of the first current. In other words, the first current is dominant when the transistor is in an on state.

The transistor described as one embodiment of the present invention includes a first gate electrode layer and a second gate electrode layer between which the oxide semiconductor layer including the channel formation region is sandwiched. A bias voltage is applied to one of the gate electrode layers to suppress generation of the second current on the back channel side. In this way, the threshold voltage of the transistor can be moved in the positive direction.

Further, a conductive layer having a large work function (e.g., 5 eV or more) can be used as the gate electrode layers, whereby the threshold voltage can be moved in the positive direction. As the conductive layer having a large work function, an In—Ga—Zn—O film including nitrogen at least at a concentration higher than that of the oxide semiconductor layer can be used, for example.

Note that in the case where the gate insulating layer (the insulating layer provided between the gate electrode layer and the oxide semiconductor layer) contains positive ions such as sodium ions, the positive ions move to the interface between the gate insulating layer and the oxide semiconductor layer in response to the application of a positive bias voltage to the gate electrode layer, which causes the threshold voltage of the transistor to move in the negative direction. However, usage of a material with a large work function for the gate electrode layer can move the positive ions at the interface between the oxide semiconductor layer and the gate insulating layer to the gate electrode layer side.

FIG. 12 shows a schematic diagram example of a band structure of an OSFET model which includes an In—Ga—Zn—O film as an oxide semiconductor layer and also includes an In—Ga—Zn—O film including nitrogen as a gate electrode layer. Here, the In—Ga—Zn—O film, which is the oxide semiconductor layer (denoted by OS in FIG. 12), has an electron affinity of 4.6 eV and a band gap of 3.2 eV. The In—Ga—Zn—O film including nitrogen, which is the gate electrode layer (denoted by GE in FIG. 12), has a work function of 5.6 eV and a band gap of 1.8 eV. Note that in FIG. 12, the oxide semiconductor layer is n-type, and the Fermi level $E_F$ is located above the center of the band gap.

As shown in FIG. 12, the energy band of the In—Ga—Zn—O film curves upward in the vicinity of the interface with the gate insulating layer (denoted by GI in FIG. 12), and the flat band voltage $V_{FB}$ is higher than 0. Thus, electric field is generated in the gate insulating layer from the interface with the oxide semiconductor layer toward the interface with the gate electrode layer; accordingly, the interface with the oxide semiconductor layer is positively charged and the interface with the gate electrode layer is negatively charged. That is, the positive ions at the interface with the oxide semiconductor layer move to the gate electrode layer side.

In the above-described manner, the usage of the material with a large work function (e.g., the In—Ga—Zn—O film including nitrogen) for the gate electrode layer also has an effect of drawing positive ions at the interface with the oxide semiconductor layer to the gate electrode layer side.

With one embodiment of the present invention, a normally-off transistor or a transistor which has a threshold voltage close to 0 V although being normally-on can be achieved.

BEST MODE FOR CARRYING OUT THE INVENTION

Figure 1A:
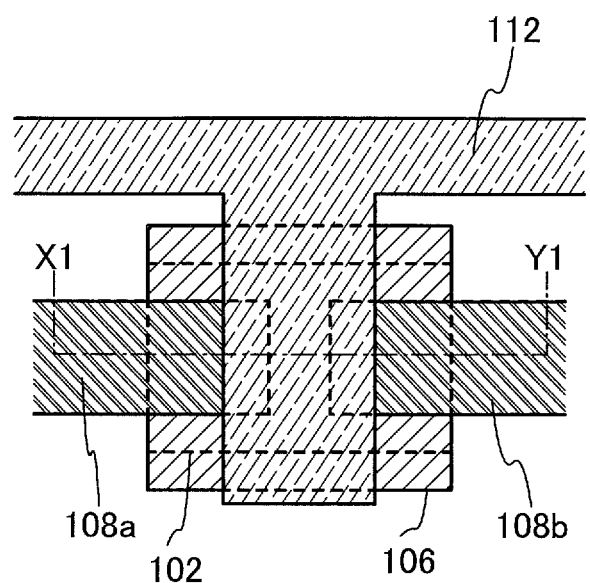
FIGS. 1A and 1B are a plan view and a cross-sectional view, respectively, illustrating one embodiment of a semiconductor device.

Embodiments of the present invention will be described below with reference to the drawings. Note that the present invention is not limited to the following description, and it will be easily understood by those skilled in the art that the mode and details can be changed in various ways. Therefore, the present invention should not be construed as being limited to the description in the following embodiments.

Note that in structures of the present invention described below, the same portions or portions having similar functions are denoted by the same reference numerals throughout different drawings, and description thereof is not repeated. Further, the same hatching pattern is applied to portions having similar functions, and the portions are not especially denoted by reference numerals in some cases.

Note that in each drawing in this specification, the size, the film thickness, or the region of each component may be exaggerated for clarity in some cases. Therefore, the scale is not limited to those in the drawings.

Note that in this specification and the like, the ordinal numbers such as "first" and "second" are used for convenience and do not denote the order of steps or the stacking order of layers. In addition, the ordinal numbers in this specification and the like do not denote particular names which specify the present invention.

In this specification, a term "parallel" indicates that the angle formed between two straight lines is greater than or equal to −10° and less than or equal to 10°, and accordingly also includes the case where the angle is greater than or equal to −5° and less than or equal to 5°.

In this specification, the trigonal and rhombohedral crystal systems are included in the hexagonal crystal system.

Embodiment 1

In this embodiment, one embodiment of a semiconductor device and one embodiment of a method for manufacturing the semiconductor device are described with reference to FIGS. 1A and 1B and FIGS. 2A to 2F. In this embodiment, a transistor including an oxide semiconductor stacked layers is described as an example of the semiconductor device.

Figure 1B:
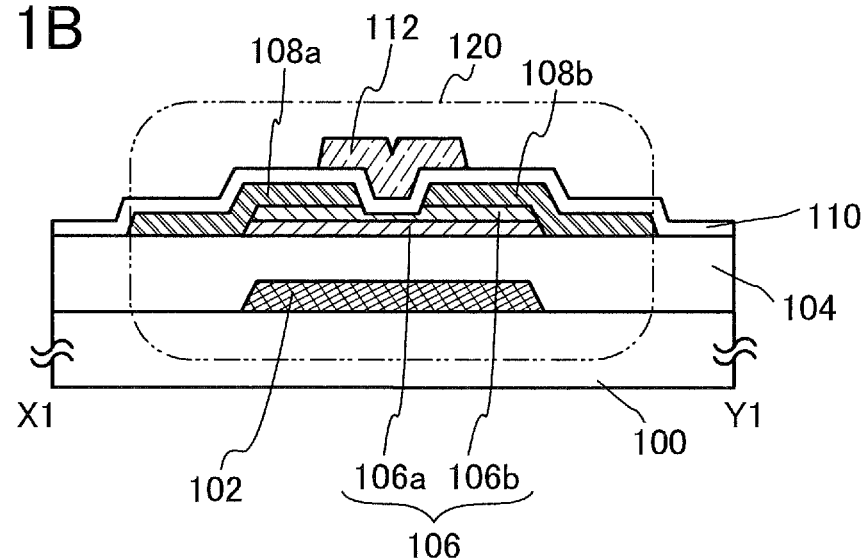

FIGS. 1A and 1B illustrate an example of a structure of a transistor 120. FIG. 1A is a plan view of the transistor 120, and FIG. 1B is a cross-sectional view taken along a chain line X1-Y1 in FIG. 1A.

As illustrated in the cross-sectional view in the channel length direction in FIG. 1B, the transistor 120 includes, over a substrate 100 having an insulating surface, a gate electrode layer 102, an insulating layer 104, an oxide semiconductor stacked layers 106 including an oxide semiconductor layer 106a and an oxide semiconductor layer 106b, a source electrode layer 108a, a drain electrode layer 108b, an insulating layer 110, and a gate electrode layer 112.

In the transistor 120, the gate electrode layer 102 overlaps with the oxide semiconductor stacked layers 106 with the insulating layer 104 sandwiched therebetween, and the gate electrode layer 112 overlaps with the oxide semiconductor stacked layers 106 with the insulating layer 110 sandwiched therebetween. Further, the oxide semiconductor layer 106b is provided over and in contact with the oxide semiconductor layer 106a. The source electrode layer 108a and the drain electrode layer 108b are in contact with the oxide semiconductor layer 106b of the oxide semiconductor stacked layers 106. In addition, the insulating layer 110 is provided over and in contact with the source electrode layer 108a, the drain electrode layer 108b, and part of the oxide semiconductor stacked layers 106. Further, in the oxide semiconductor stacked layers 106, a region in contact with the insulating layer 110 has a smaller thickness than regions in contact with the source electrode layer 108a or the drain electrode layer 108b.

In the oxide semiconductor stacked layers 106, the region with a small thickness is formed by etching a part of the oxide semiconductor stacked layers 106 in processing a conductive film for forming the source electrode layer 108a and the drain electrode layer 108b or by performing etching treatment on an exposed region of the oxide semiconductor stacked layers 106 after forming the source electrode layer 108a and the drain electrode layer 108b. The region with a small thickness serves as a channel formation region of the transistor 120. In the oxide semiconductor stacked layers 106, since the channel formation region has a small thickness, the number of oxygen vacancies included in the region can be smaller than that in the other regions; thus, such a small thickness of the channel formation region can result in a reduction in the density of donors in the channel formation region.

Further, by reducing the thickness of the channel formation region in the oxide semiconductor stacked layers 106, the resistance of the regions in contact with the source electrode layer 108a or the drain electrode layer 108b can be lower than that of the channel formation region. Thus, contact resistance with the source electrode layer 108a and the drain electrode layer 108b can be reduced.

As described above, in a transistor using an oxide semiconductor layer, the decrease in the thickness of the oxide semiconductor layer, which is the active layer, and the decrease in the density of donors included in the oxide semiconductor layer are the keys to achieving a normally-off transistor. Since the transistor 120 described in this embodiment includes the oxide semiconductor stacked layers 106 with the thin channel formation region, the movement of the threshold voltage of the transistor in the negative direction can be suppressed.

In this embodiment, an example in which part of the oxide semiconductor layer 106b in the oxide semiconductor stacked layers 106 is etched to form the region with small thickness in the oxide semiconductor stacked layers 106 is described. However, without limitation to this method, the region with a small thickness may be formed by etching part of the oxide semiconductor layer 106a or by etching part of the oxide semiconductor layer 106a and part of the oxide semiconductor layer 106b, in embodiments of the present invention.

It is preferable that the oxide semiconductor layer 106b in the oxide semiconductor stacked layers 106 include an oxide semiconductor which includes at least indium (In) and gallium (Ga) and has the following relation between the indium content and the gallium content: In≤Ga. The formation energy of oxygen vacancies is larger and thus oxygen vacancies are less likely to generate in Ga than in In; therefore, the oxide having a composition relation of In≤Ga has more stable characteristics than the oxide having a composition relation of In>Ga. With such an oxide semiconductor material, the reliability of the transistor can be improved.

Further, it is preferable that the oxide semiconductor layer 106a in the oxide semiconductor layers 106 include an oxide semiconductor which includes at least In and Ga and has the following relation between the indium content and the gallium content: In>Ga. In an oxide semiconductor, the s orbital of heavy metal mainly contributes to carrier transfer, and when the In content in the oxide semiconductor is increased, overlap of the s orbitals is likely to be increased. Therefore, the oxide having a composition relation of In>Ga has higher mobility than the oxide having a composition relation of In≤Ga. Accordingly, when a channel is formed in the oxide semiconductor layer 106a, mobility of the transistor can be increased.

The thickness of the oxide semiconductor layer 106a is preferably more than or equal to 3 nm and less than or equal to 15 nm, and further preferably more than or equal to 7 nm and less than or equal to 12 nm. In addition, the thickness of the oxide semiconductor layer 106b in the regions in contact with the source electrode layer 108a or the drain electrode layer 108b is preferably more than or equal to 3 nm and less than or equal to 15 nm, and further preferably more than or equal to 5 nm and less than or equal to 12 nm. Further, the thickness of the region functioning as the channel formation region (the region between the source electrode layer 108a and the drain electrode layer 108b) in the oxide semiconductor stacked layers 106 is preferably more than or equal to 3 nm and less than 20 nm, and further preferably more than or equal to 5 nm and less than 15 nm.

The insulating layer 104 in contact with the oxide semiconductor layer 106a preferably includes a region including oxygen in excess of the stoichiometric composition (hereinafter also referred to as an oxygen-excess region). By making the insulating layer 104 in contact with the oxide semiconductor layer 106a include an oxygen-excess region, supply of oxygen to the oxide semiconductor layer 106a is possible. Accordingly, release of oxygen from the oxide semiconductor layer 106a can be prevented and oxygen vacancies can be compensated. Similarly, the insulating layer 110 in contact with the oxide semiconductor layer 106b preferably includes an oxygen-excess region.

The gate electrode layer 102 at least on the side of the surface in contact with the insulating layer 104 is preferably formed using a material having a larger work function than the oxide semiconductor layer 106a, and further preferably formed using a material having a work function that is 1 electron volt or more larger than the oxide semiconductor layer 106a. Similarly, the gate electrode layer 112 at least on the side of the surface in contact with the insulating layer 110 is preferably formed using a material having a larger work function than the oxide semiconductor layer 106b, and further preferably formed using a material having a work function that is 1 electron volt or more larger than the oxide semiconductor layer 106b. As such a material, an In—Ga—Zn—O film including nitrogen, an In—Sn—O film including nitrogen, an In—Ga—O film including nitrogen, an In—Zn—O film including nitrogen, a Sn—O film including nitrogen, an In—O film including nitrogen, or a metal nitride film (such as an indium nitride film, a zinc nitride film, a tantalum nitride film, or a tungsten nitride film) can be used, for example. These films each have a work function of 5 electron volts or more and thus can make the threshold voltage of the transistor positive. Accordingly, a normally-off switching transistor can be achieved. For example, in the case of using an In—Ga—Zn—O film including nitrogen, an In—Ga—Zn—O film including nitrogen at least at higher concentration than those of the oxide semiconductor layer 106a and the oxide semiconductor layer 106b is used.

In this embodiment, the gate electrode layer 102 is an electrode layer functioning as a back gate and the potential of the gate electrode layer 102 can be set as appropriate to a fixed potential, GND, or the like. By controlling the gate voltage applied to the back gate, the threshold voltage of the transistor 120 can be controlled. Thus, the transistor 120 can be normally-off.

Further, in the case of applying a negative bias voltage to the gate electrode layer 102, positive ions (e.g., Na+) contained as impurities in the insulating layer 104 can be moved to the gate electrode layer 102 side.

An example of a method for manufacturing the transistor 120 will be described below with reference to FIGS. 2A to 2F.

First, the gate electrode layer 102 is formed over the substrate 100 having an insulating surface.

There is no particular limitation on the substrate that can be used as the substrate 100 having an insulating surface as long as it has heat resistance enough to withstand heat treatment performed later. For example, a glass substrate of barium borosilicate glass, aluminoborosilicate glass, or the like, a ceramic substrate, a quartz substrate, or a sapphire substrate can be used. Alternatively, a single crystal semiconductor substrate or a polycrystalline semiconductor substrate made of silicon, silicon carbide, or the like, a compound semiconductor substrate made of silicon germanium or the like, an SOI substrate, or the like can be used. Furthermore, any of these substrates provided with a semiconductor element may be used as the substrate 100.

The gate electrode layer 102 can be formed using a metal material such as molybdenum, titanium, tantalum, tungsten, aluminum, copper, chromium, neodymium, scandium, or the like, or an alloy material containing any of these metal materials as its main component. Alternatively, a semiconductor film typified by a polycrystalline silicon film doped with an impurity element such as phosphorus, or a silicide film such as a nickel silicide film may be used as the gate electrode layer 102. The gate electrode layer 102 may have a single-layer structure or a stacked-layer structure. The gate electrode layer 102 may have a tapered shape with a taper angle of more than or equal to 30° and less than or equal to 70° for example. Here, the taper angle refers to an angle formed between a side surface of a layer having a tapered shape and a bottom surface of the layer.

The material of the gate electrode layer 102 may be a conductive material such as indium oxide-tin oxide, indium oxide containing tungsten oxide, indium zinc oxide containing tungsten oxide, indium oxide containing titanium oxide, indium tin oxide containing titanium oxide, indium oxide-zinc oxide, or indium tin oxide to which silicon oxide is added.

Note that the gate electrode layer 102 at least on the side of the surface that is to be in contact with the insulating layer 104 is preferably formed using a material having a larger work function than the oxide semiconductor layer provided in contact with the insulating layer 104, and further preferably formed using a material having a work function that is 1 electron volt or more larger than the oxide semiconductor layer. As the conductive material having a large work function, a metal oxide including nitrogen can be used for example.

Next, an insulating layer 103 is formed over the gate electrode layer 102 so as to cover the gate electrode layer 102. The insulating layer 103 can be provided to have a single-layer structure or a stacked-layer structure including a film including silicon oxide, silicon oxynitride, aluminum oxide, aluminum oxynitride, hafnium oxide, gallium oxide, zinc gallium oxide, or a mixed material of these materials by a plasma CVD method, a sputtering method, or the like.

The insulating layer 103 is a layer to be processed into the insulating layer 104 that is in contact with the oxide semiconductor stacked layers 106. Accordingly, the insulating layer 103 preferably includes an oxygen-excess region. In order to provide the oxygen-excess region in the insulating layer 103, the insulating layer 103 may be formed in an oxygen atmosphere, for example. Alternatively, oxygen may be introduced into the formed insulating layer 103 to provide the oxygen-excess region in the insulating layer 103.

Figure 2A:
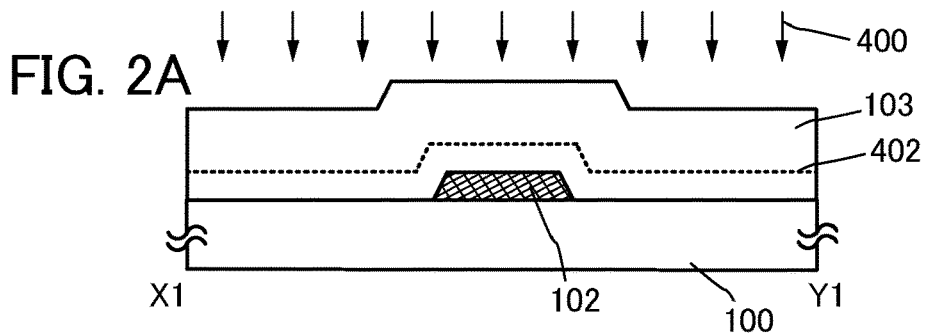
FIGS. 2A to 2F illustrate an example of a method for manufacturing a semiconductor device.

In this embodiment, oxygen 400 (at least including any of oxygen radicals, oxygen atoms, or oxygen ions) is introduced into the insulating layer 103 to form an oxygen-excess region 402 (see FIG. 2A). As a method for introducing oxygen, an ion implantation method, an ion doping method, a plasma immersion ion implantation method, plasma treatment, or the like may be used.

In FIG. 2A, the concentration peak position of oxygen introduced into the insulating layer 103 is indicated by dotted lines, and the region with the oxygen peak is illustrated as the oxygen-excess region 402. Note that the depth to which oxygen is introduced and the distribution of the introduced oxygen are not limited to those in the structure illustrated in FIG. 2A.

Figure 2B:
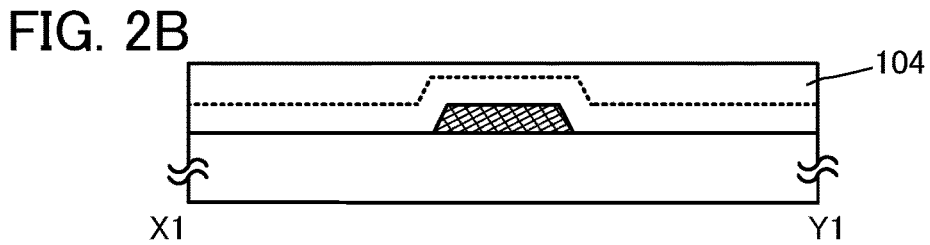

Next, planarization treatment is performed on a surface of the insulating layer 103; thus, the insulating layer 104 is formed (see FIG. 2B). The planarization treatment may be, but is not particularly limited to, polishing treatment (e.g., chemical mechanical polishing), dry etching treatment, plasma treatment, a combination of these treatments, or the like.

Note that in order not to remove the oxygen-excess region 402 in the planarization treatment for the insulating layer 103, the depth to which the oxygen 400 is introduced, the removed thickness of the insulating layer 103, and the like are adjusted as appropriate.

Further in order to reduce impurities such as hydrogen (including water, a hydroxyl group, and the like) and make an oxygen-excess state in the insulating layer, the insulating layer 104 (or the insulating layer 103 before the planarization treatment) may be subjected to heat treatment for removing hydrogen or a hydrogen compound (for dehydration or dehydrogenation).

Figure 2C:
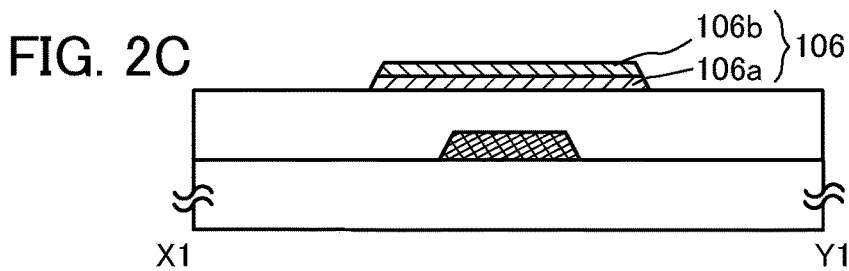

Next, an oxide semiconductor film to be the oxide semiconductor layer 106a and an oxide semiconductor film to be the oxide semiconductor layer 106b are stacked over the insulating layer 104 and then processed into an island shape, so that the oxide semiconductor stacked layers 106 including the oxide semiconductor layer 106a and the oxide semiconductor layer 106b is formed (see FIG. 2C).

The oxide semiconductor layer 106a and the oxide semiconductor layer 106b may each have an amorphous structure or a crystal structure. In the case where the oxide semiconductor layer 106a or 106b has an amorphous structure, heat treatment may be performed on the oxide semiconductor stacked layers 106 in a later manufacturing step so that the oxide semiconductor layer has crystallinity. The heat treatment for crystallizing the amorphous oxide semiconductor layer is performed at a temperature higher than or equal to 250° C. and lower than or equal to 700° C., preferably higher than or equal to 400° C., further preferably higher than or equal to 500° C., still further preferably higher than or equal to 550° C. Note that the heat treatment can also serve as another heat treatment in the manufacturing process.

The oxide semiconductor films to be the oxide semiconductor layer 106a and the oxide semiconductor layer 106b can be formed by a sputtering method, a molecular beam epitaxy (MBE) method, a CVD method, a pulse laser deposition method, an atomic layer deposition (ALD) method, or the like as appropriate.

In the formation of the oxide semiconductor films, the hydrogen concentration in the oxide semiconductor films is preferably reduced as much as possible. In order to reduce the hydrogen concentration, for example, in the case where the oxide semiconductor films are formed by a sputtering method, a high-purity rare gas (typically argon), high-purity oxygen, or a high-purity mixed gas of a rare gas and oxygen, from which impurities such as hydrogen, water, a hydroxyl group, and hydride have been removed, is used as appropriate as an atmosphere gas supplied to a deposition chamber of a sputtering apparatus.

The oxide semiconductor films are formed in such a manner that a sputtering gas from which hydrogen and moisture have been removed is introduced into the deposition chamber while moisture remaining therein is removed, whereby the hydrogen concentration in the formed oxide semiconductor films can be reduced. In order to remove moisture remaining in the deposition chamber, an entrapment vacuum pump such as a cryopump, an ion pump, or a titanium sublimation pump is preferably used. The evacuation unit may be a turbo molecular pump provided with a cold trap. A cryopump has a high capability in removing a hydrogen molecule, a compound containing a hydrogen atom such as water ($H_2O$) (preferably, also a compound containing a carbon atom), and the like; therefore, the impurity concentration in the oxide semiconductor films formed in the deposition chamber which is evacuated using a cryopump can be reduced.

Further, in the case where the oxide semiconductor films are formed by a sputtering method, the relative density (the fill rate) of a metal oxide target which is used for deposition is greater than or equal to 90% and less than or equal to 100%, preferably greater than or equal to 95% and less than or equal to 99.9%. With the use of a metal oxide target with a high relative density, dense oxide semiconductor films can be deposited.

To reduce the impurity concentration in the oxide semiconductor films, it is also effective to form the oxide semiconductor films while the substrate 100 is kept at high temperature. The temperature at which the substrate 100 is heated may be higher than or equal to 150° C. and lower than or equal to 450° C.; the substrate temperature is preferably higher than or equal to 200° C. and lower than or equal to 350° C. The crystalline oxide semiconductor films can be formed by heating the substrate at a high temperature in the deposition.

A structure of an oxide semiconductor film is described below.

An oxide semiconductor film is classified roughly into a single-crystal oxide semiconductor film and a non-single-crystal oxide semiconductor film. The non-single-crystal oxide semiconductor film includes any of an amorphous oxide semiconductor film, a microcrystalline oxide semiconductor film, a polycrystalline oxide semiconductor film, a c-axis aligned crystalline oxide semiconductor (CAAC-OS) film, and the like.

The amorphous oxide semiconductor film has disordered atomic arrangement and no crystalline component. A typical example thereof is an oxide semiconductor film in which no crystal part exists even in a microscopic region, and the whole of the film is amorphous.

The microcrystalline oxide semiconductor film includes a microcrystal (also referred to as nanocrystal) with a size greater than or equal to 1 nm and less than 10 nm, for example. Thus, the microcrystalline oxide semiconductor film has a higher degree of atomic order than the amorphous oxide semiconductor film. Hence, the density of defect states of the microcrystalline oxide semiconductor film is lower than that of the amorphous oxide semiconductor film.

The CAAC-OS film is one of oxide semiconductor films including a plurality of crystal parts, and most of each crystal part fits inside a cube whose one side is less than 100 nm. Thus, there is a case where a crystal part included in the CAAC-OS film fits a cube whose one side is less than 10 nm, less than 5 nm, or less than 3 nm. The density of defect states of the CAAC-OS film is lower than that of the microcrystalline oxide semiconductor film. The CAAC-OS film is described in detail below.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

On the other hand, according to the TEM image of the CAAC-film observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS film.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle (2θ) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction perpendicular to the c-axis, a peak appears frequently when 2θ is around 56°. This peak is derived from the (110) plane of the $InGaZnO_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of $InGaZnO_4$, six peaks appear. The six peaks are derived from crystal planes equivalent to the (110) plane. On the other hand, in the case of a CAAC-OS film, a peak is not clearly observed even when 0 scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where a shape of the CAAC-OS film is changed by etching or the like, the c-axis might not be necessarily parallel to a normal vector of a formation surface or a normal vector of a top surface of the CAAC-OS film.

Further, the degree of crystallinity in the CAAC-OS film is not necessarily uniform. For example, in the case where crystal growth leading to the CAAC-OS film occurs from the vicinity of the top surface of the film, the degree of the crystallinity in the vicinity of the top surface is higher than that in the vicinity of the formation surface in some cases. Further, when an impurity is added to the CAAC-OS film, the crystallinity in a region to which the impurity is added is changed, and the degree of crystallinity in the CAAC-OS film varies depends on regions.

Note that when the CAAC-OS film with an $InGaZnO_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ do not appear at around 36°.

In a transistor using the CAAC-OS film, change in electric characteristics due to irradiation with visible light or ultraviolet light is small. Thus, the transistor has high reliability.

The oxide semiconductor layer 106a and the oxide semiconductor layer 106b each may be any one of an amorphous oxide semiconductor film, a microcrystalline oxide semiconductor film, and a CAAC-OS film or a mixed film including two or more films of these. Note that the oxide semiconductor layer 106a and the oxide semiconductor layer 106b may be a stacked film including two or more films of an amorphous oxide semiconductor film, a microcrystalline oxide semiconductor film, and a CAAC-OS film, for example.

In the case where a CAAC-OS film is employed as the oxide semiconductor layer 106a and/or the oxide semiconductor layer 106b, the following methods can be used for forming the CAAC-OS film as examples. One of the methods is to form an oxide semiconductor film at a film formation temperature higher than or equal to 200° C. and lower than or equal to 450° C., thereby obtaining c-axis alignment substantially perpendicular to a surface. Another method is to form a thin oxide semiconductor film and then subject the film to heat treatment at a temperature higher than or equal to 200° C. and lower than or equal to 700° C., thereby obtaining c-axis alignment substantially perpendicular to a surface. The other method is to form a first thin oxide semiconductor film, subject the film to heat treatment at a temperature higher than or equal to 200° C. and lower than or equal to 700° C., and then form a second oxide semiconductor film, thereby obtaining c-axis alignment substantially perpendicular to a surface.

An oxide semiconductor including at least indium (In) is used for the oxide semiconductor layer 106a and the oxide semiconductor layer 106b. In particular, an oxide semiconductor including indium and zinc (Zn) is preferable. As a stabilizer for reducing variation in electric characteristics of a transistor using the oxide semiconductor, gallium (Ga) is preferably additionally contained. It is preferable that one or more elements selected from tin (Sn), hafnium (Hf), aluminum (Al), and zirconium (Zr) be contained as a stabilizer.

As another stabilizer, one or a plurality of kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, any of the following can be used: indium oxide; tin oxide; zinc oxide; a two-component metal oxide such as an In—Zn-based oxide, an In—Mg-based oxide, or an In—Ga-based oxide; a three-component metal oxide such as an In—Ga—Zn-based oxide (also referred to as IGZO), an In—Al—Zn-based oxide, an In—Sn—Zn-based oxide, an In—Hf—Zn-based oxide, an In—La—Zn-based oxide, an In—Ce—Zn-based oxide, an In—Pr—Zn-based oxide, an In—$N_d$—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; and a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

Note that here, for example, an In—Ga—Zn-based oxide means an oxide including In, Ga, and Zn as its main components, and there is no particular limitation on the ratio of In, Ga, and Zn. The In—Ga—Zn-based oxide may include a metal element other than the In, Ga, and Zn.

Alternatively, a material represented by $InMO_3(ZnO)_m$ (m>0, m is not an integer) may be used as an oxide semiconductor. Note that M represents one or more metal elements selected from Ga, Fe, Mn, and Co. Alternatively, as the oxide semiconductor, a material represented by a chemical formula, $In_2SnO_5(ZnO)_n$ (n>0, n is an integer) may be used.

For example, an In—Ga—Zn-based oxide with an atomic ratio where In:Ga:Zn=1:1:1 (=□1/3:1/3:1/3), In:Ga:Zn=2:2:1 (=2/5:2/5:1/5), In:Ga:Zn=3:1:2 (=1/2:1/6:1/3), or any of oxides whose composition is in the neighborhood of the above compositions can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or any of oxides whose composition is in the neighborhood of the above compositions may be used.

However, an oxide semiconductor including indium that is included in a transistor is not limited to the materials given above; a material with an appropriate composition may be used for a transistor including an oxide semiconductor including indium depending on needed electrical characteristics (e.g., field-effect mobility, threshold voltage, and variation). In order to obtain the needed electrical characteristics, the carrier concentration, the impurity concentration, the defect density, the atomic ratio between a metal element and oxygen, the interatomic distance, the density, and the like are preferably set to appropriate values.

For example, high field-effect mobility can be obtained relatively easily in a transistor including an In—Sn—Zn-based oxide. Also in the case of a transistor including an In—Ga—Zn-based oxide, the field-effect mobility can be increased by reducing the defect density in a bulk.

Note that for example, the expression "the composition of an oxide including In, Ga, and Zn at the atomic ratio, In:Ga:Zn=a:b:c (a+b+c=1), is in the neighborhood of the composition of an oxide including In, Ga, and Zn at the atomic ratio, In:Ga:Zn=A:B:C (A+B+C=1)" means that a, b, and c satisfy the following relation: $(a-A)^2+(b-B)^2+(c-C)^2 \le r^2$, and r may be 0.05, for example. For example, r may be 0.05. The same applies to other oxides.

Further, oxide semiconductors whose crystallinities are different from each other may be employed for the oxide semiconductor layer 106a and the oxide semiconductor layer 106b. That is, an appropriate combination of any of a single crystal oxide semiconductor, a polycrystalline oxide semiconductor, a microcrystalline oxide semiconductor, an amorphous oxide semiconductor, and a CAAC-OS may be employed.

Further, the oxide semiconductor stacked layers 106 is preferably subjected to heat treatment for removing excess hydrogen (including water and a hydroxyl group) contained in the oxide semiconductor stacked layers 106 (for dehydration or dehydrogenation). The temperature of the heat treatment is higher than or equal to 300° C. and lower than or equal to 700° C., or lower than the strain point of the substrate. The heat treatment can be performed under reduced pressure, a nitrogen atmosphere, or the like. Hydrogen, which is an impurity imparting n-type conductivity, can be removed from the oxide semiconductor by this heat treatment.

Note that the heat treatment for the dehydration or dehydrogenation may be performed at any timing in the manufacturing process of the transistor 120 as long as the heat treatment is performed after the formation of the oxide semiconductor layer. The heat treatment for dehydration or dehydrogenation may be performed a plurality of times, or may also serve as another heat treatment.

Note that the heat treatment for dehydration or dehydrogenation is preferably performed before the oxide semiconductor films are processed into an island shape because oxygen contained in the insulating layer 104 can be prevented from being released by the heat treatment.

In the heat treatment, it is preferable that water, hydrogen, or the like be not contained in nitrogen or a rare gas such as helium, neon, or argon. The purity of nitrogen or the rare gas such as helium, neon, or argon which is introduced into the heat treatment apparatus is set to preferably 6N (99.9999%) or higher, further preferably 7N (99.99999%) or higher (that is, the impurity concentration is preferably 1 ppm or lower, further preferably 0.1 ppm or lower).

In addition, after the oxide semiconductor stacked layers 106 (or the oxide semiconductor films before the processing into the island shape) is heated by the heat treatment, a high-purity oxygen gas, a high-purity dinitrogen gas, or ultra dry air (the moisture amount is less than or equal to 20 ppm (−55° C. by conversion into a dew point), preferably less than or equal to 1 ppm, further preferably less than or equal to 10 ppb, in the measurement with use of a dew point meter of a cavity ring down laser spectroscopy (CRDS) system) may be introduced into the same furnace while the heating temperature is being maintained or being gradually decreased. It is preferable that water, hydrogen, or the like be not contained in the oxygen gas or the dinitrogen monoxide gas. The purity of the oxygen gas or the dinitrogen monoxide gas which is introduced into the heat treatment apparatus is preferably 6N or more, further preferably 7N or more (i.e., the impurity concentration in the oxygen gas or the dinitrogen monoxide gas is preferably 1 ppm or lower, further preferably 0.1 ppm or lower). The oxygen gas or the dinitrogen monoxide gas acts to supply oxygen that is a main component of the oxide semiconductor to compensate for a reduction of oxygen in the step for removing an impurity for the dehydration or dehydrogenation, so that the oxide semiconductor layers can be highly-purified and i-type (intrinsic) oxide semiconductor layers.

Since there is a possibility that oxygen, which is a main component of an oxide semiconductor, is also released and reduced by dehydration or dehydrogenation treatment, oxygen (including at least one of an oxygen radical, an oxygen atom, and an oxygen ion) may be introduced into the oxide semiconductor layer which has been subjected to the dehydration or dehydrogenation treatment to supply oxygen to the layer.

Oxygen is added and supplied to the dehydrated or dehydrogenated oxide semiconductor layer, so that the oxide semiconductor layer can be highly purified and be i-type (intrinsic). Variation in electric characteristics of a transistor having the highly-purified and i-type (intrinsic) oxide semiconductor is suppressed, and the transistor is electrically stable.

In the step of addition of oxygen to the oxide semiconductor layer, oxygen may be directly added to the oxide semiconductor layer or may be added to the oxide semiconductor layer through another film such as the insulating layer 110 to be formed later. When oxygen is introduced through another film, an ion implantation method, an ion doping method, a plasma immersion ion implantation method, or the like may be used. In the case where oxygen is directly introduced into the exposed oxide semiconductor layer, plasma treatment or the like can be used in addition to the above-described methods.

As a gas for supplying oxygen, a gas containing 0 may be used; for example, an $O_2$ gas, an $N_2O$ gas, a $CO_2$ gas, a CO gas, or an $NO_2$ gas may be used. Note that a rare gas (e.g., an Ar gas) may be contained in the supply gas of the oxygen.

For example, in the case where an oxygen ion is introduced into the oxide semiconductor layer by an ion implantation method, the dose can be greater than or equal to $1 \times 10^{13}$ ions/cm² and less than or equal to $5 \times 10^{16}$ ions/cm².

Alternatively, oxygen may be supplied to the oxide semiconductor layer in the following manner: an insulating layer in contact with the oxide semiconductor layer (the insulating layer 104 or the insulating layer 110) is formed to have an oxygen-excess region; and heat treatment is performed in a state where the insulating layer and the oxide semiconductor layer are in contact with each other, so that excess oxygen contained in the insulating layer is diffused to the oxide semiconductor layer. This heat treatment can serve as another heat treatment in the process for manufacturing the transistor 120.

The timing of supply of oxygen to the oxide semiconductor layer is not particularly limited to the above as long as it is after the formation of the oxide semiconductor layer. The step of introducing oxygen into the oxide semiconductor layer may be performed a plurality of times. Further, heat treatment for dehydration or dehydrogenation and/or supply of oxygen may be performed separately on each of the oxide semiconductor layers or may be performed once on the oxide semiconductor stacked layers after the oxide semiconductor stacked layers 106 having a stacked-layer structure is formed.

The insulating layer 104 and the oxide semiconductor film to be processed into the oxide semiconductor layer 106a are preferably formed in succession without being exposed to air. By the successive formation of the insulating layer 104 and the oxide semiconductor film, impurities such as hydrogen and moisture can be prevented from being adsorbed onto a surface of the insulating layer 104.

Figure 2D:
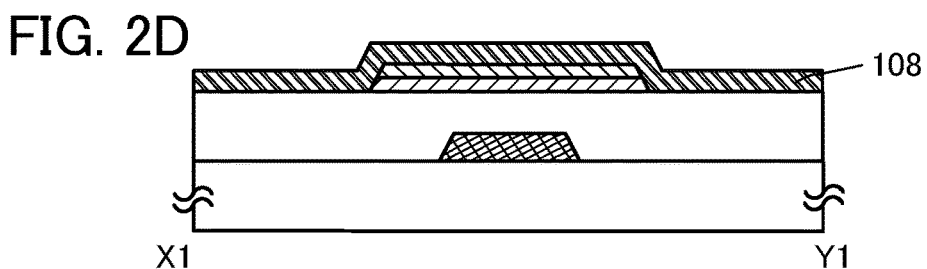

Next, a conductive film 108 to be processed into the source electrode layer 108a and the drain electrode layer 108b is formed over the oxide semiconductor stacked layers 106 (see FIG. 2D). As the conductive film 108, for example, a metal film containing an element selected from Al, Cr, Cu, Ta, Ti, Mo, or W, or a metal nitride film containing any of the above elements as a component (e.g., a titanium nitride film, a molybdenum nitride film, or a tungsten nitride film) can be used. Alternatively, a film of a high-melting-point metal such as Ti, Mo, or W or a metal nitride film of any of these elements (a titanium nitride film, a molybdenum nitride film, or a tungsten nitride film) may be stacked on one of or both a bottom side and a top side of a metal film of Al, Cu, or the like. Further alternatively, the conductive film used for the source electrode layer 108a and the drain electrode layer 108b may be formed using a conductive metal oxide. As the conductive metal oxide, indium oxide ($In_2O_3$), tin oxide ($SnO_2$), zinc oxide (ZnO), indium oxide-tin oxide alloy ($In_2O_3$—$SnO_2$), an indium oxide-zinc oxide alloy ($In_2O_3$—ZnO), or any of these metal oxide materials in which silicon oxide is contained can be used.

As the conductive film 108, a metal nitride film such as an In—Ga—Zn—O film including nitrogen, an In—Sn—O film including nitrogen, an In—Ga—O film including nitrogen, an In—Zn—O film including nitrogen, a Sn—O film including nitrogen, or an In—O film including nitrogen can be used. These films include the same constituent elements as the oxide semiconductor layer 106b and can therefore stabilize the interface with the oxide semiconductor layer 106b. For example, the conductive film 108 can have a stacked-layer structure in which an In—Ga—Zn—O film including nitrogen and a tungsten film are stacked from the side in contact with the oxide semiconductor layer 106b.

Figure 2E:
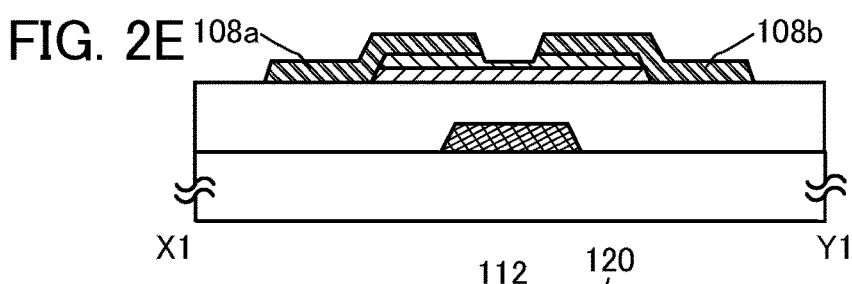
Figure 2F:
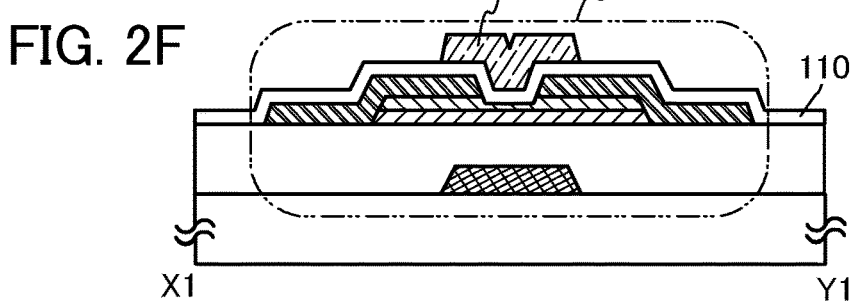

Next, the conductive film 108 is selectively etched to form the source electrode layer 108a and the drain electrode layer 108b (see FIG. 2E). The source electrode layer 108a and the drain electrode layer 108b may have a tapered shape. It is preferable that the source electrode layer 108a and the drain electrode layer 108b have a tapered shape to relieve concentration of electric field between the source and the drain.

By this etching treatment, part of the oxide semiconductor layer 106b is also etched, so that the region with a small thickness is formed between the source electrode layer 108a and the drain electrode layer 108b. Alternatively, after the source electrode layer 108a and the drain electrode layer 108b are formed, the exposed part of the oxide semiconductor layer 106b may be subjected to etching treatment (e.g., wet etching treatment) to form the region with a small thickness. The thickness of the oxide semiconductor layer 106b in the region with a small thickness, which is formed by processing treatment on the source electrode layer 108a and the drain electrode layer 108b and/or later etching treatment, is preferably more than or equal to 1 nm and less than or equal to 2 nm.

Then, the insulating layer 110 is formed to cover the exposed oxide semiconductor layer 106b, the source electrode layer 108a, and the drain electrode layer 108b. The insulating layer 110 functions as a gate insulating layer. A conductive film to be the gate electrode layer 112 (including a wiring formed of the same film) is formed over the insulating layer 110, and is selectively etched, so that the gate electrode layer 112 is formed (see FIG. 2F).

The insulating layer 110 can be formed using a similar material and formation method to those of the insulating layer 104. Note that the thickness of the insulating layer 110 is preferably more than or equal to 5 nm and less than or equal to 30 nm, further preferably more than or equal to 9 nm and less than or equal to 22 nm.

The gate electrode layer 112 can be formed using similar material and formation method to those of the gate electrode layer 102. Note that the gate electrode layer 112 at least on the side of the surface that is in contact with the insulating layer 110 is preferably formed using a material having a larger work function than the oxide semiconductor layer 106b, and further preferably formed using a material having a work function that is 1 electron volt or more larger than the oxide semiconductor layer 106b.

In the above-described manner, the transistor 120 in this embodiment can be manufactured.

The transistor 120 described in this embodiment includes an oxide semiconductor stacked layers 106 in which a channel formation region is thinner than the other region (e.g., a region in contact with the source electrode layer 108a or the drain electrode layer 108b and excluding a tapered portion at the edge of the oxide semiconductor layer). This can suppress the shift of the threshold voltage of the transistor 120 in the negative direction.

Further, the transistor 120 described in this embodiment includes the gate electrode layer 102 and the gate electrode layer 112 between which the semiconductor stacked layers 106 including a channel formation region is sandwiched. By application of a negative bias voltage to the gate electrode layer 102, generation of the second current on the back channel side can be suppressed. In this way, the threshold voltage of the transistor 120 can be moved in the positive direction.

The structures, methods, and the like which are described in this embodiment can be combined as appropriate with any of the structures, methods, and the like which are described in the other embodiments.

Embodiment 2

In this embodiment, as an example of a semiconductor device which includes the transistor described in Embodiment 1, a semiconductor device which can hold stored data even when not powered and which has an unlimited number of write cycles will be described with reference to drawings.

Figure 3A:
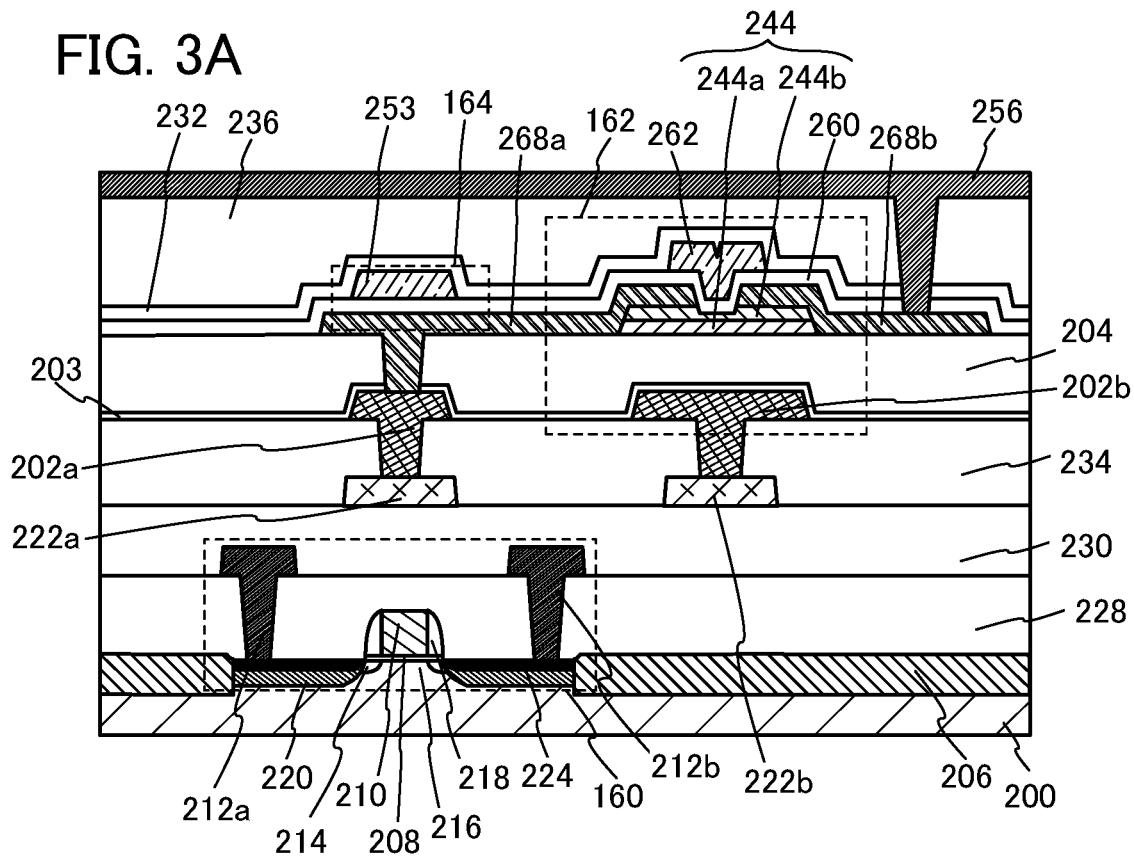
FIGS. 3A and 3B are a cross-sectional view and a circuit diagram, respectively, illustrating one embodiment of a semiconductor device.
Figure 3B:
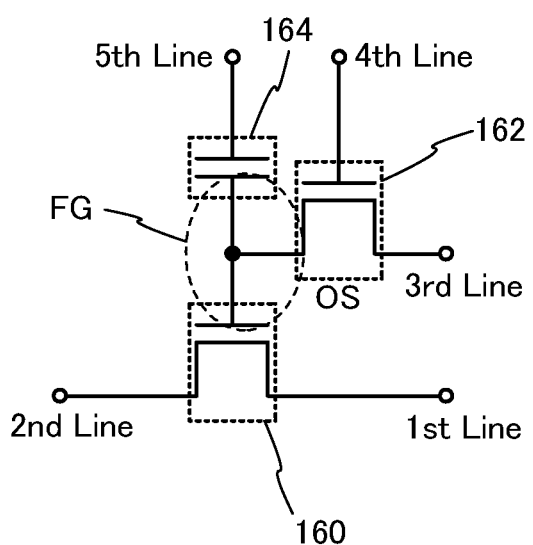

FIGS. 3A and 3B illustrate one example of a structure of the semiconductor device. FIG. 3A is a cross-sectional view of the semiconductor device, and FIG. 3B is a circuit diagram of the semiconductor device.

The semiconductor device illustrated in FIG. 3A includes a transistor 160 including a first semiconductor material in a lower portion, and a transistor 162 including a second semiconductor material in an upper portion. As the transistor 162, the transistor of one embodiment of the present invention described in Embodiment 1 can be employed.

Here, the first semiconductor material and the second semiconductor material are preferably materials having different band gaps. For example, the first semiconductor material may be a semiconductor material (e.g., silicon) other than an oxide semiconductor, and the second semiconductor material may be an oxide semiconductor. A transistor including a material other than an oxide semiconductor can operate at high speed easily. On the other hand, a transistor including an oxide semiconductor has characteristics of enabling holding of charge for a long time.

Although the above-described transistors are both n-channel transistors here, it is needless to say that p-channel transistors can be used. The specific structure of the semiconductor device, such as the material used for the semiconductor device and the structure of the semiconductor device, is not necessarily limited to those described here except for the use of the transistor described in Embodiment 1, which is formed using an oxide semiconductor to hold data, as the transistor 162.

The transistor 160 in FIG. 3A includes a channel formation region 216 provided in a substrate 200 including a semiconductor material (e.g., silicon), impurity regions 214 and high-concentration impurity regions 220 (these are simply collectively referred to as impurity regions) which are provided so that the channel formation region 216 is sandwiched therebetween, intermetallic compound regions 224 in contact with the high-concentration impurity regions 220, a gate insulating layer 208 provided over the channel formation region 216, a gate electrode layer 210 provided over the gate insulating layer 208, sidewall insulating layers 218 provided on side surfaces of the gate electrode layer 210, an electrode layer 212a, and an electrode layer 212b.

The electrode layer 212a and the electrode layer 212b are electrode layers functioning as a source electrode layer and a drain electrode layer and are electrically connected to the intermetallic compound regions 224 through contact holes provided in the insulating layer 228 that is formed over the gate electrode layer 210. The insulating layer 228 may have a single-layer structure or a stacked-layer structure including an inorganic insulating film such as a silicon oxide film, a silicon oxynitride film, an aluminum oxide film, an aluminum oxynitride film, a silicon nitride film, an aluminum nitride film, a silicon nitride oxide film, or an aluminum nitride oxide film.

An element isolation insulating layer 206 is provided over the substrate 200 to surround the transistor 160.

The transistor 160 formed using a single crystal semiconductor substrate can operate at high speed. Thus, when the transistor is used as a reading transistor, data can be read at a high speed.

The transistor 162 illustrated in FIG. 3A is a transistor in which an oxide semiconductor is used for a channel formation region. A transistor in which in which an oxide semiconductor is used for a channel formation region can achieve extremely small off-state current characteristics. Note that an oxide semiconductor layer included in the transistor 162 is preferably highly purified. By using a highly purified oxide semiconductor, the transistor 162 can have more favorable off-state current characteristics.

Since the off-state current of the transistor 162 is small, stored data can be held for a long time owing to such a transistor. In other words, the semiconductor memory device in which refresh operation is unnecessary or the frequency of refresh operation is extremely low can be provided, which leads to a sufficient reduction of power consumption.

The transistor 162 includes an oxide semiconductor stacked layers 244 which includes an oxide semiconductor layer 244a and an oxide semiconductor layer 244b and in which a channel formation region is thinner than the other region (e.g., a region in contact with an electrode layer 268a or an electrode layer 268b). In the oxide semiconductor stacked layers 244 included in the transistor 162, the channel formation region is thinned, which can suppress the shift of the threshold voltage in the negative direction. Further, the transistor 162 includes a gate electrode layer 202b which overlaps with the oxide semiconductor stacked layers 244 with an insulating layer 203 and an insulating layer 204 sandwiched therebetween, in addition to a gate electrode layer 262 which overlaps with the oxide semiconductor stacked layers 244 with a gate insulating layer 260 sandwiched therebetween. The gate electrode layer 202b can be used as a back gate electrode. By application of a negative bias voltage to the gate electrode layer 202b, flow of the second current on the back channel side can be suppressed, which can move the threshold voltage of the transistor 162 in the positive direction. Consequently, the transistor 162 can be a normally-off transistor.

The insulating layer 203 and the insulating layer 204 can each be a film including silicon oxide, silicon oxynitride, aluminum oxide, aluminum oxynitride, hafnium oxide, gallium oxide, zinc gallium oxide, or a mixed material of these materials. Note that the insulating layer 204 in contact with the oxide semiconductor stacked layers 244 (specifically the oxide semiconductor layer 244a) preferably includes an oxygen-excess region.

Note that it is preferable that the insulating layer 203 be a film having a barrier property against oxygen, in order to prevent release of oxygen from the insulating layer 204. As the film having a barrier property against oxygen, a film having a lower oxygen-transmitting property than the insulating layer 204 can be used, and specifically a single-layer structure or a stacked-layer structure including an oxide film or a nitride film of, for example, aluminum, aluminum to which magnesium is added, aluminum to which titanium is added, magnesium, titanium, or the like can be employed. Furthermore, as the insulating layer 203, a film having a low impurity (e.g., hydrogen, moisture)-transmitting property in addition to having a barrier property against oxygen is preferably used. As such a film, an aluminum oxide film can preferably be used. With the use of an aluminum oxide film as the insulating layer 203, release of oxygen is prevented, and in addition, entry of impurities such as hydrogen and moisture, which might cause variation in electric characteristics of the transistor 162, can be suppressed.

Note that for favorable coverage by the insulating layer 203, it is preferable that the gate electrode layer 202b and an electrode layer 202a have a tapered shape. The taper angle is preferably more than or equal to 30° and less than or equal to 70°.

An insulating layer 232 and an insulating layer 236 with a single-layer structure or a stacked-layer structure are provided over the transistor 162. As the insulating layer 232 or the insulating layer 236, a film including a material similar to that of the insulating layer 203 and the insulating layer 204 can be used. If necessary, planarization treatment such as CMP treatment may be performed after the insulating layer 236 is formed to planarize a surface of the insulating layer 236. Alternatively, as the insulating layer 236, a planarization insulating film may be formed in order to reduce surface roughness due to the transistor or an inorganic insulating film and a planarization insulating film may be stacked. For the planarization insulating film, an organic material such as a polyimide-based resin, an acrylic-based resin, or a benzocyclobutene-based resin can be used. Besides the above organic materials, a low-dielectric constant material (a low-k material) or the like can be used.

A wiring layer 256 is provided over the insulating layer 236. The wiring layer 256 is a wiring which connects the transistor 162 to another transistor. The wiring layer 256 is electrically connected to the electrode layer 268b through a contact hole formed in the insulating layer 236, the insulating layer 232, and the gate insulating layer 260. Note that an electrode layer may be additionally formed in the contact hole to electrically connect the wiring layer 256 to the electrode layer 268b.

In addition, a conductive layer 253 is provided in a region overlapping with the electrode layer 268a of the transistor 162 with the gate insulating layer 260 sandwiched therebetween. The electrode layer 268a, the gate insulating layer 260, and the conductive layer 253 form a capacitor 164. That is, the electrode layer 268a of the transistor 162 functions as one electrode of the capacitor 164, and the conductive layer 253 functions as the other electrode of the capacitor 164. Note that the capacitor 164 may be omitted if a capacitor is not needed. Alternatively, the capacitor 164 may be independently provided above the transistor 162.

In this embodiment, the conductive layer 253 can be formed in the same manufacturing step as the gate electrode layer 262 of the transistor 162.

The electrode layer 268a is electrically connected to the electrode layer 202a that is formed in the same layer as the gate electrode layer 202b. Further, the electrode layer 202a is electrically connected to an electrode layer 222a through a contact hole provided in an insulating layer 234. Although not shown in FIG. 3A, the electrode layer 222a is electrically connected to the gate electrode layer 210 of the transistor 160. Accordingly, the electrode layer 268a of the transistor 162 is electrically connected to the gate electrode layer 210 of the transistor 160.

An insulating layer 230 and the insulating layer 234 can each have a structure similar to that of the insulating layer 228. Note that if necessary, the insulating layer 228, the insulating layer 230, and the insulating layer 234 may be subjected to planarization treatment. Moreover, the structure enabling electrical connection between the electrode layer 268a of the transistor 162 and the gate electrode layer 210 of the transistor 160 is not limited to the structure illustrated in FIG. 3A, and the structure regarding intervening electrode layers (or wiring layers) or insulating layers can be determined as appropriate. For example, an electrode layer may be additionally provided between the electrode layer 202a and the electrode layer 222a, or the electrode layer 268a may be directly connected to the gate electrode layer 210.

Note that in the case where the insulating layer 204 includes an oxygen-excess region, there is a possibility that excess oxygen included in the insulating layer 204 may be released at the time of forming the contact hole; for this reason, the contact hole is preferably provided in a region not overlapping with the oxide semiconductor stacked layers 244. In FIG. 3A, the electrode layer 202a is electrically connected to the electrode layer 268a through the contact hole provided in the insulating layer 204 in the region not overlapping with the oxide semiconductor stacked layers 244. Note that a contact hole provided below the insulating layer 204 (on the transistor 160 side) may overlap with the oxide semiconductor stacked layers 244. In the example illustrated in FIG. 3A, the gate electrode layer 202b of the transistor 162 is electrically connected to the wiring layer 222b provided in the same layer as the electrode layer 222a.

In FIG. 3A, the transistor 160 and the transistor 162 are provided so as to at least partly overlap with each other. Further, the transistor 162 and the capacitor 164 are preferably provided so as to overlap with at least part of the transistor 160. For example, the conductive layer 253 included in the capacitor 164 is provided so as to at least partly overlap with the gate electrode layer 210 of the transistor 160. With such a planar layout, the area occupied by the semiconductor device can be reduced; thus, higher integration can be achieved.

Next, an example of a circuit configuration corresponding to FIG. 3A is illustrated in FIG. 3B.

In FIG. 3B, a first wiring (1st Line) is electrically connected to the source electrode layer of the transistor 160. A second wiring (2nd Line) is electrically connected to the drain electrode layer of the transistor 160. A third wiring (3rd Line) is electrically connected to one of a source electrode layer and a drain electrode layer of the transistor 162, and a fourth wiring (4th Line) is electrically connected to a gate electrode layer of the transistor 162. The gate electrode layer of the transistor 160 and the other of the source electrode layer and the drain electrode layer of the transistor 162 are electrically connected to one electrode of the capacitor 164. A fifth wiring (5th line) and the other electrode of the capacitor 164 are electrically connected to each other.

The semiconductor device illustrated in FIG. 3B utilizes a characteristic of capable of holding the potential of the gate electrode layer of the transistor 160, and thus enables data writing, holding, and reading as follows.

Writing and holding of data will be described. First, the potential of the fourth line is set to a potential at which the transistor 162 is turned on, so that the transistor 162 is turned on. Accordingly, the potential of the third wiring is supplied to the gate electrode layer of the transistor 160 and to the capacitor 164. That is, predetermined charge is supplied to the gate electrode layer of the transistor 160 (writing). Here, one of two kinds of charges providing different potential levels (hereinafter referred to as low-level charge and high-level charge) is given. After that, the potential of the fourth wiring is set to a potential at which the transistor 162 is turned off, so that the transistor 162 is turned off. Thus, the charge given to the gate electrode layer of the transistor 160 is held (holding).

Since the amount of off-state current of the transistor 162 is extremely small, the charge of the gate electrode layer of the transistor 160 is held for a long time.

Next, reading of data will be described. By supplying an appropriate potential (a reading potential) to the fifth wiring while supplying a predetermined potential (a constant potential) to the first wiring, the potential of the second wiring varies depending on the amount of charge held at the gate electrode layer of the transistor 160. This is because in general, when the transistor 160 is an n-channel transistor, an apparent threshold voltage $V_{th\_H}$ in the case where the high-level charge is given to the gate electrode layer of the transistor 160 is lower than an apparent threshold voltage $V_{th\_L}$ in the case where the low-level charge is given to the gate electrode layer of the transistor 160. Here, an apparent threshold voltage refers to the potential of the fifth line, which is needed to turn on the transistor 160. Thus, the potential of the fifth wiring is set to a potential $V_0$ that is between $V_{th\_H}$ and $V_{th\_L}$, whereby charge supplied to the gate electrode layer of the transistor 160 can be determined. For example, in the case where a high-level charge is given in writing, when the potential of the fifth wiring is set to $V_0$ ($>V_{th\_H}$), the transistor 160 is turned on. In the case where a low-level charge is given in writing, even when the potential of the fifth wiring is set to $V_0$ ($<V_{th\_L}$), the transistor 160 remains in an off state. Therefore, the stored data can be read by the potential of the second line.

Note that in the case where memory cells are arrayed to be used, only data of desired memory cells needs to be read. In the case where data is not read out, a potential at which the transistor 160 is off regardless of the state of the gate electrode layer of the transistor 160, that is, a potential smaller than $V_{th\_H}$ may be given to the fifth wiring. Alternatively, a potential which allows the transistor 160 to be on regardless of a state of the gate electrode layer, that is, a potential higher than $V_{th\_L}$ may be given to the fifth wiring.

When a transistor having a channel formation region formed using an oxide semiconductor and having extremely small off-state current is applied to the semiconductor device in this embodiment, the semiconductor device can store data for an extremely long period. In other words, power consumption can be adequately reduced because refresh operation becomes unnecessary or the frequency of refresh operation can be extremely low. Moreover, stored data can be held for a long period even when power is not supplied (note that a potential is preferably fixed). Here, by achieving normally-off characteristics of the transistor 162, a configuration in which a ground potential can be input to the gate (gate electrode layer 262) of the transistor 162 when power is off can be made. With this configuration, the transistor 162 can remain off and stored data can be kept held even when power is off.

Further, in the semiconductor device described in this embodiment, high voltage is not needed for writing data and there is no problem of deterioration of elements. For example, unlike a conventional nonvolatile memory, it is not necessary to inject and extract electrons into and from a floating gate, and thus a problem such as deterioration of a gate insulating layer does not occur at all. In other words, the semiconductor device according to one embodiment of the present invention does not have a limit on the number of write cycles which is a problem in a conventional nonvolatile memory, and reliability thereof is drastically improved. Furthermore, data is written depending on the on state and the off state of the transistor, whereby high-speed operation can be easily achieved.

In the above-described manner, a miniaturized and highly-integrated semiconductor device having high electrical characteristics and a method for manufacturing the semiconductor device can be provided.

The structures, methods, and the like which are described in this embodiment can be combined as appropriate with any of the structures, methods, and the like which are described in the other embodiments.

Embodiment 3

In this embodiment, a semiconductor device including the transistor described in Embodiment 1, which can hold stored data even when not powered, which does not have a limitation on the number of write cycles, and which has a structure different from the structure described in Embodiment 2 will be described with reference to FIGS. 4A and 4B.

Figure 4A:
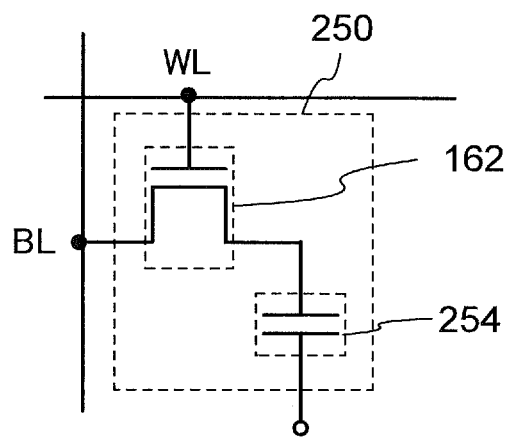
FIGS. 4A and 4B are a circuit diagram and a perspective view, respectively, illustrating one embodiment of a semiconductor device.
Figure 4B:
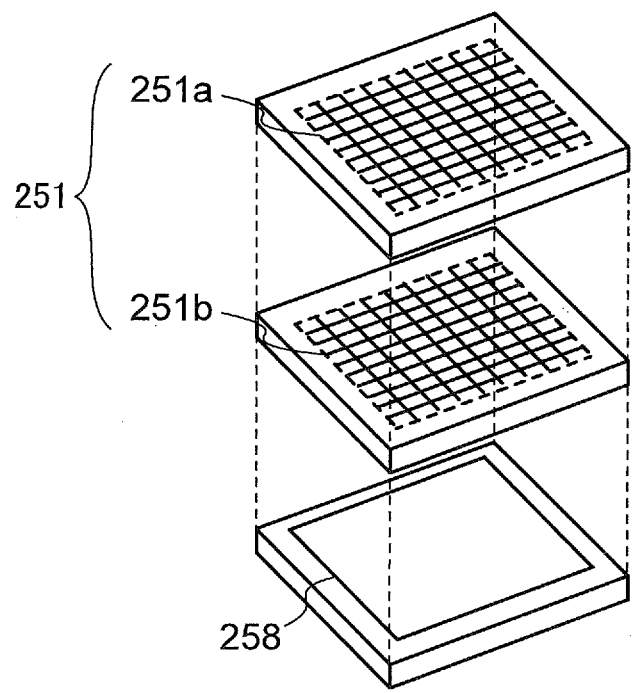

FIG. 4A illustrates an example of a circuit configuration of the semiconductor device, and FIG. 4B is a conceptual diagram illustrating an example of the semiconductor device. First, the semiconductor device illustrated in FIG. 4A will be described, and then, the semiconductor device illustrated in FIG. 4B will be described.

In the semiconductor device illustrated in FIG. 4A, a bit line BL is electrically connected to the source electrode layer or the drain electrode layer of the transistor 162, a word line WL is electrically connected to the gate electrode layer of the transistor 162, and the source electrode layer or the drain electrode layer of the transistor 162 is electrically connected to a first terminal of a capacitor 254.

Next, writing and holding of data in the semiconductor device (a memory cell 250) illustrated in FIG. 4A will be described.

First, the potential of the word line WL is set to a potential at which the transistor 162 is turned on, so that the transistor 162 is turned on. Accordingly, the potential of the bit line BL is supplied to the first terminal of the capacitor 254 (writing). After that, the potential of the word line WL is set to a potential at which the transistor 162 is turned off, so that the transistor 162 is turned off. Thus, the potential of the first terminal of the capacitor 254 is held (holding).

The transistor 162 including an oxide semiconductor has extremely low off-state current. For that reason, the potential of the first terminal of the capacitor 254 (or a charge accumulated in the capacitor 254) can be held for an extremely long period by turning off the transistor 162. Here, by achieving normally-off characteristics of the transistor 162, a configuration in which a ground potential can be input to the gate of the transistor 162 when power is off can be made. With this configuration, the transistor 162 can remain off and stored data can be kept held even when power is off.

Next, reading of data will be described. When the transistor 162 is turned on, the bit line BL which is in a floating state and the capacitor 254 are electrically connected to each other, and the charge is redistributed between the bit line BL and the capacitor 254. As a result, the potential of the bit line BL is changed. The amount of change in potential of the bit line BL varies depending on the potential of the first terminal of the capacitor 254 (or the charge accumulated in the capacitor 254).

For example, the potential of the bit line BL after charge redistribution is $(C_B \times V_{B0} + C \times V)/(C_B + C)$, where V is the potential of the first terminal of the capacitor 254, C is the capacitance of the capacitor 254, $C_B$ is the capacitance of the bit line BL (hereinafter also referred to as bit line capacitance), and $V_{B0}$ is the potential of the bit line BL before the charge redistribution. Therefore, it can be found that assuming that the memory cell 250 is in either of two states which are the state in which the potential of the first terminal of the capacitor 254 is $V_1$ and the state in which the potential of the first terminal of the capacitor 254 is $V_0$ ($V_1 > V_0$), the potential of the bit line BL in the case of holding the potential $V_1$ ($=(C_B \times V_{B0} + C \times V_1)/(C_B + C)$) is higher than the potential of the bit line BL in the case of holding the potential $V_0$ ($=(C_B \times V_{B0} + C \times V_0)/(C_B + C)$).

Then, by comparing the potential of the bit line BL with a predetermined potential, data can be read.

As described above, the semiconductor device illustrated in FIG. 4A can hold charge that is accumulated in the capacitor 254 for a long time because the off-state current of the transistor 162 is extremely low. In other words, power consumption can be sufficiently reduced because refresh operation becomes unnecessary or the frequency of refresh operation can be extremely low. Moreover, stored data can be held for a long period even when power is not supplied.

Next, the semiconductor device illustrated in FIG. 4B will be described.

The semiconductor device illustrated in FIG. 4B includes a memory cell array 251a and a memory cell array 251b including a plurality of memory cells 250 illustrated in FIG. 4A as memory circuits in the upper portion, and a peripheral circuit 258 in the lower portion, which is necessary for operating the memory cell array 251 (the memory cell arrays 251a and 251b). Note that the peripheral circuit 258 is electrically connected to the memory cell array 251.

In the structure illustrated in FIG. 4B, the peripheral circuit 258 can be provided under the memory cell array 251 (the memory cell arrays 251a and 251b). Thus, the size of the semiconductor device can be decreased.

It is preferable that a semiconductor material of the transistor provided in the peripheral circuit 253 be different from that of the transistor 162. For example, silicon, germanium, silicon germanium, silicon carbide, or gallium arsenide can be used, and a single crystal semiconductor is preferably used. Alternatively, an organic semiconductor material or the like may be used. A transistor including such a semiconductor material can operate at sufficiently high speed. Further, with the transistor, a variety of circuits (such as a logic circuit or a driver circuit) which are required to operate at high speed can be achieved favorably.

Note that FIG. 4B illustrates, as an example, the semiconductor device in which two memory cell arrays 251 (the memory cell arrays 251a and 251b) are stacked; however, the number of memory cell arrays to be stacked is not limited thereto. Three or more memory cell arrays may be stacked.

In the above-described manner, a miniaturized and highly-integrated semiconductor device having high electrical characteristics and a method for manufacturing the semiconductor device can be provided.

This embodiment can be implemented in appropriate combination with any of the structures described in the other embodiments.

Embodiment 4

Figure 13A:
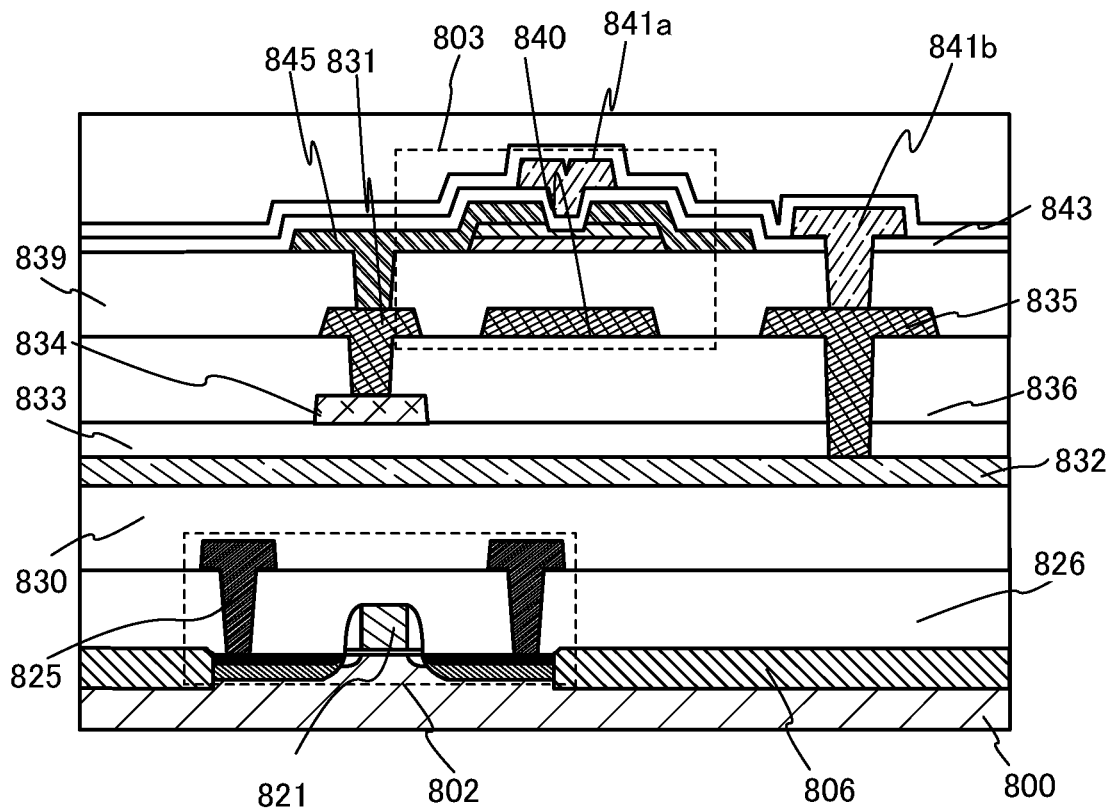
FIG. 13A is a cross-sectional view and FIGS. 13B and 13C are circuit diagrams illustrating one embodiment of a semiconductor device.
Figure 13B:
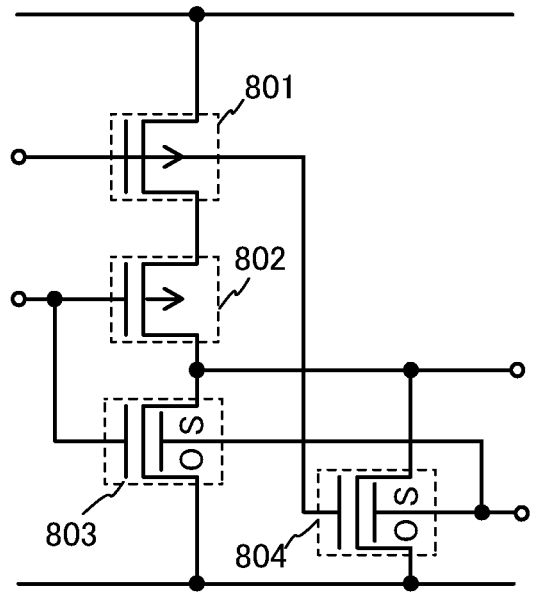
Figure 13C:
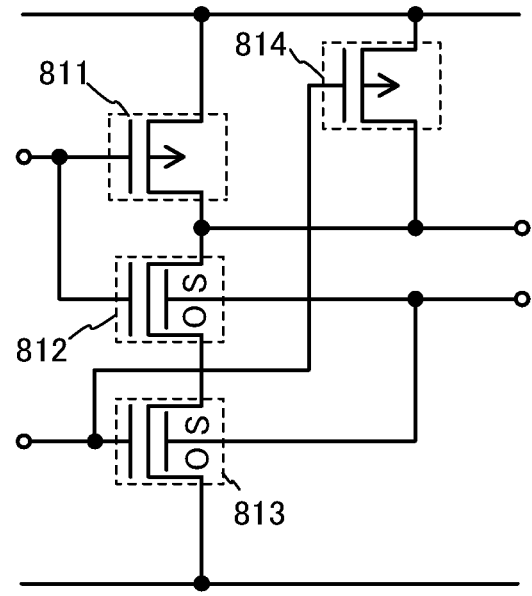

In this embodiment, as other examples of the semiconductor device that uses the transistor described in this specification, a NOR circuit and a NAND circuit, which are logic circuits, are illustrated in FIGS. 13A to 13C. FIG. 13B illustrates the NOR circuit, and FIG. 13C illustrates the NAND circuit. FIG. 13A is a cross-sectional view illustrating the structure of a transistor 802 and a transistor 803 in the NOR circuit in FIG. 13B.

In the NOR circuit and the NAND circuit illustrated in FIGS. 13B and 13C, p-channel transistors 801, 802, 811, and 814 can have the same structure as the transistor 160 described in Embodiment 2. In this embodiment, boron (B), aluminum (Al), gallium (Ga), or the like which is an impurity element imparting p-type conductivity is introduced into a substrate 800 that uses an n-type semiconductor material (e.g., n-type single crystal silicon substrate), to form the p-channel transistors including p-type impurity regions.

In addition, transistors each having the same structure as the transistor 120 in Embodiment 1 and including an oxide semiconductor film in which a channel formation region is formed are applied to n-channel transistors 803, 804, 812, and 813.

In the NOR circuit and the NAND circuit illustrated in FIGS. 13A to 13C, the transistors 803, 804, 812, and 813 each include a thinned channel formation region in the oxide semiconductor stacked layers; accordingly, the shift of the threshold voltages of the transistors in the negative direction can be suppressed. Further, a first gate electrode layer and a second gate electrode layer are provided so that an oxide semiconductor stacked layers is sandwiched therebetween with an insulating layer sandwiched between the oxide semiconductor stacked layers and each of the first gate electrode layer and the second gate electrode. One of the gate electrode layers is used as a back gate. By controlling the potential of the back gate as appropriate, for example, to be GND, the threshold voltages of the transistors 803, 804, 812, and 813 can be moved in the positive direction; consequently, the transistors can be normally-off.

In the example described in this embodiment, the gate electrode layers which are provided in the transistors 803 and the transistor 804 and each function as a back gate are electrically connected to each other in the NOR circuit, and the gate electrode layers which are provided in the transistor 812 and the transistor 813 and each function as a back gate are electrically connected to each other in the NAND circuit. However, without limitation to the above structure, a structure in which each of the gate electrode layers functioning as back gates is independently electrically controlled may be employed.

The semiconductor device illustrated in FIG. 13A is an example in which a single crystal silicon substrate is used as the substrate 800, the transistor 802 is formed using the single crystal silicon substrate, and the transistor 803 including a channel formation region formed using the oxide semiconductor stacked layers is stacked over the transistor 802. Over the substrate 800, an element isolation insulating layer 806 is provided to surround the transistor 802.

An electrode layer 841b electrically connected to a gate electrode layer 841a of the transistor 803 is electrically connected to an electrode layer 835 that is an electrode layer provided in the same layer as a gate electrode layer 840 through a contact hole provided in a gate insulating layer 843 and an insulating layer 839. The electrode layer 835 is electrically connected to a wiring layer 832 through a contact hole provided in an insulating layer 836 and an insulating layer 833. Although not clearly illustrated in FIG. 13A, the wiring layer 832 is electrically connected to a gate electrode layer 821 of the transistor 802 through a contact hole provided in an insulating layer 830 and an insulating layer 826. Accordingly, the gate electrode layer 841a of the transistor 803 is electrically connected to the gate electrode layer 821 of the transistor 802.

Furthermore, although not clearly illustrated in FIG. 13A, an electrode layer 825 of the transistor 802 is electrically connected to a wiring layer 834, and the wiring layer 834 is electrically connected to an electrode layer 845 of the transistor 803 with an electrode layer 831. Accordingly, the electrode layer 825 of the transistor 802 is electrically connected to the electrode layer 845 of the transistor 803.

Note that the structure enabling electrical connection between the electrode layer (or the gate electrode layer) of the transistor 802 and the electrode layer (or the gate electrode layer) of the transistor 803 is not limited to the structure illustrated in FIG. 13A, and the structure regarding intervening electrode layers (or wiring layers) or insulating layers can be determined as appropriate.

The overlapping structure of the transistor 802 and the transistor 803 illustrated in FIG. 13A can reduce the area of the semiconductor device, leading to higher integration. Further, since the transistor 802 is a transistor that can be normally-off, the logic circuit can be controlled precisely.

In the above-described manner, a miniaturized and highly-integrated semiconductor device having high electrical characteristics and a method for manufacturing the semiconductor device can be provided.

The structures, methods, and the like which are described in this embodiment can be combined as appropriate with any of the structures, methods, and the like which are described in the other embodiments.

Embodiment 5

In this embodiment, a central processing unit (CPU) at least part of which includes the transistor disclosed above in Embodiment 1 will be described as an example of a semiconductor device.

Figure 5A:
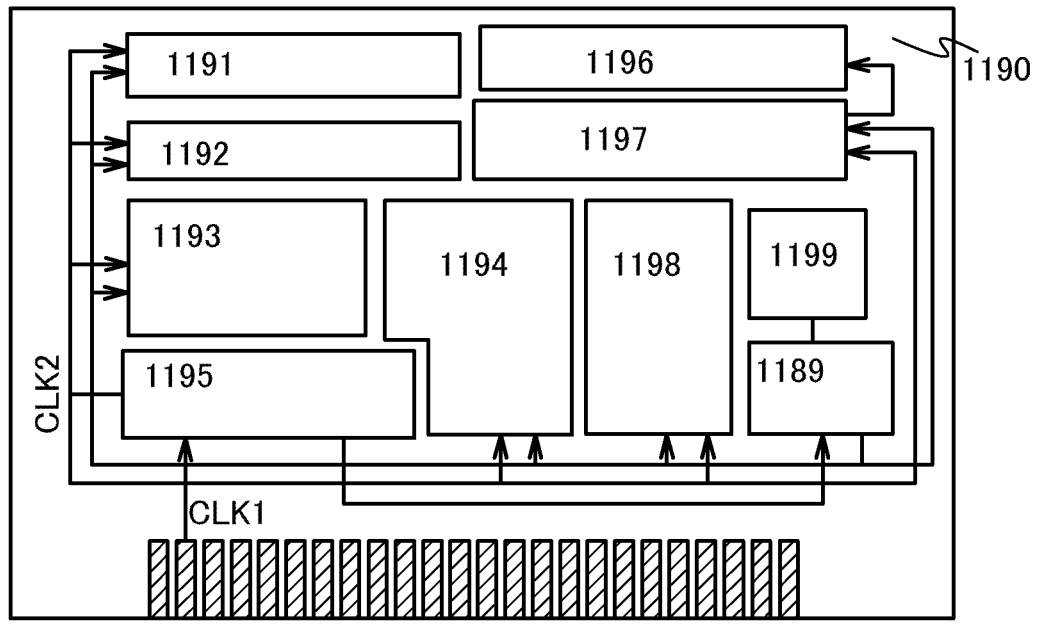
FIG. 5A is a block diagram illustrating one embodiment of a semiconductor device and FIGS. 5B and 5C are circuit diagrams each illustrating part of the semiconductor device.

FIG. 5A is a block diagram illustrating a specific configuration of a CPU. The CPU illustrated in FIG. 5A includes an arithmetic logic unit (ALU) 1191, an ALU controller 1192, an instruction decoder 1193, an interrupt controller 1194, a timing controller 1195, a register 1196, a register controller 1197, a bus interface (Bus I/F) 1198, a rewritable ROM 1199, and a ROM interface (ROM I/F) 1189 over a substrate 1190. A semiconductor substrate, an SOI substrate, a glass substrate, or the like is used as the substrate 1190. The ROM 1199 and the ROM interface 1189 may be provided on a separate chip. Obviously, the CPU illustrated in FIG. 5A is just an example in which the configuration is simplified, and actual CPUs may have various configurations depending on the application.

An instruction input to the CPU through the bus interface 1198 is input to the instruction decoder 1193, decoded therein, and then input to the ALU controller 1192, the interrupt controller 1194, the register controller 1197, and the timing controller 1195.

The ALU controller 1192, the interrupt controller 1194, the register controller 1197, and the timing controller 1195 conduct various controls based on the decoded instruction. Specifically, the ALU controller 1192 generates signals for controlling the operation of the ALU 1191. While the CPU is executing a program, the interrupt controller 1194 processes an interrupt request from an external input/output device or a peripheral circuit on the basis of its priority or a mask state. The register controller 1197 generates an address of the register 1196, and reads and writes data from and to the register 1196 depending on the state of the CPU.

The timing controller 1195 generates signals for controlling timing of operation of the ALU 1191, the ALU controller 1192, the instruction decoder 1193, the interrupt controller 1194, and the register controller 1197. For example, the timing controller 1195 is provided with an internal clock generator for generating an internal clock signal CLK2 based on a reference clock signal CLK1, and supplies the internal clock signal CLK2 to the above-mentioned various circuits.

In the CPU illustrated in FIG. 5A, a memory cell is provided in the register 1196. The memory cell described above in Embodiment 2 or 3 can be used in the register 1196.

In the CPU illustrated in FIG. 5A, the register controller 1197 selects operation of holding data in the register 1196 in accordance with an instruction from the ALU 1191. That is, the register controller 1197 selects whether data is held by a logic element which inverts a logic (logic level) or by a capacitor in the memory cell included in the register 1196. When data holding by the logic element which inverts a logic (logic level) is selected, a power supply voltage is supplied to the memory cell in the register 1196. When data holding by the capacitor is selected, the data in the capacitor is rewritten, and supply of the power supply voltage to the memory cell in the register 1196 can be stopped.

Figure 5B:
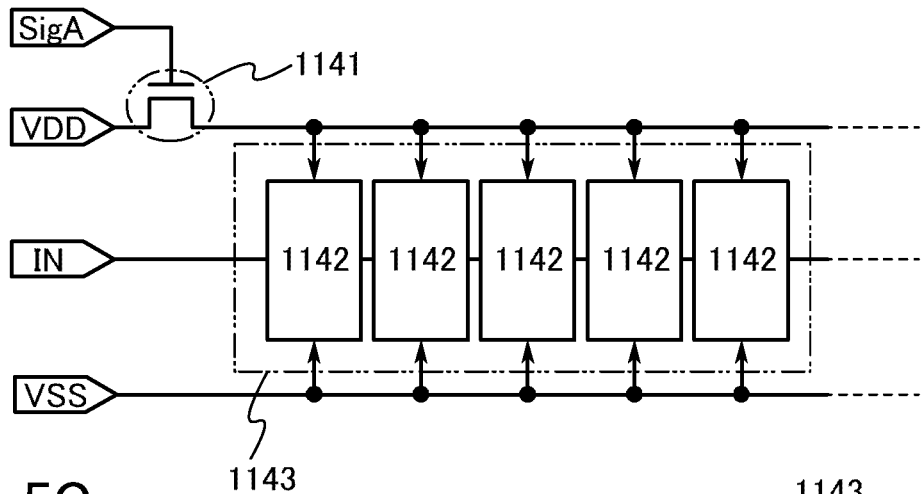
Figure 5C:
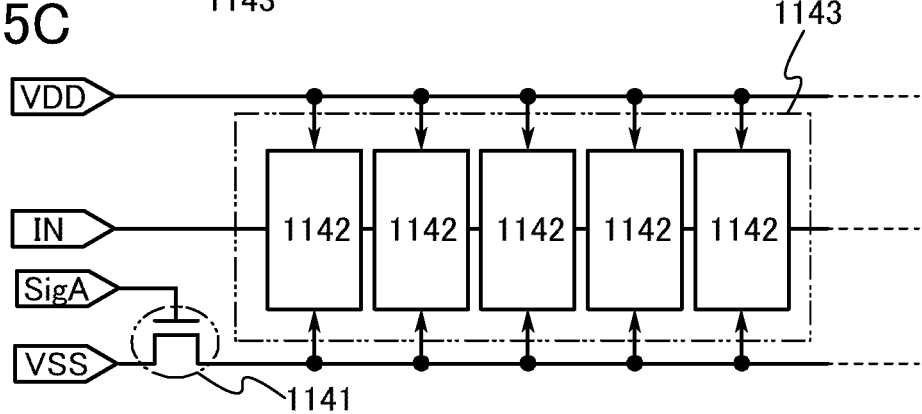

The power supply can be stopped by a switching element provided between a memory cell group and a node to which a power supply potential VDD or a power supply potential VSS is supplied, as illustrated in FIG. 5B or FIG. 5C. Circuits illustrated in FIGS. 5B and 5C are described below.

FIGS. 5B and 5C each illustrate an example of a configuration of the storage circuit including the transistor disclosed above in Embodiment 1 as a switching element for controlling supply of a power supply potential to a memory cell.

The storage device illustrated in FIG. 5B includes a switching element 1141 and a memory cell group 1143 including a plurality of memory cells 1142. Specifically, as each of the memory cells 1142, the memory cell described in Embodiment 2 or 3 can be used. Each of the memory cells 1142 included in the memory cell group 1143 is supplied with a high-level power supply potential VDD through the switching element 1141. Further, each of the memory cells 1142 included in the memory cell group 1143 is supplied with a potential of a signal IN and a low-level power supply potential VSS.

As the switching element 1141 in FIG. 5B, the transistor described above in Embodiment 1 is used. The switching of the transistor is controlled by a signal SigA supplied to the gate electrode layer thereof.

Note that FIG. 5B illustrates a configuration in which the switching element 1141 includes only one transistor; however, one embodiment of the present invention is not limited thereto. The switching element 1141 may include a plurality of transistors. In the case where the switching element 1141 includes a plurality of transistors functioning as switching elements, the plurality of transistors may be connected to each other in parallel, in series, or in combination of parallel connection and series connection.

Although the switching element 1141 controls the supply of the high-level power supply potential VDD to each of the memory cells 1142 included in the memory cell group 1143 in FIG. 5B, the switching element 1141 may control the supply of the low-level power supply potential VSS.

FIG. 5C illustrates an example of a storage device in which each of the memory cells 1142 included in the memory cell group 1143 is supplied with the low-level power supply potential VSS through the switching element 1141. The supply of the low-level power supply potential VSS to each of the memory cells 1142 included in the memory cell group 1143 can be controlled by the switching element 1141.

When a switching element is provided between a memory cell group and a node to which the power supply potential VDD or the power supply potential VSS is supplied, data can be held even in the case where operation of a CPU is temporarily stopped and the supply of the power supply voltage is stopped; accordingly, power consumption can be reduced. Specifically, for example, while a user of a personal computer does not input data to an input device such as a keyboard, the operation of the CPU can be stopped, so that power consumption can be reduced.

Although the CPU is given as an example here, the transistor can also be applied to an LSI such as a digital signal processor (DSP), a custom LSI, or a field programmable gate array (FPGA).

The structures, methods, and the like which are described in this embodiment can be combined as appropriate with any of the structures, methods, and the like which are described in the other embodiments.

Further, Table 2 shows a comparison between a spin-MRAM (spin torque transfer MRAM) which is known as a spintronics device and a memory including an oxide semiconductor.

TABLE 2

| | Spintronics (MTJ element) | OS/Si |
|---|---|---|
| 1) Heat resistance | Unstable | Extremely stable (up to 150° C.) |
| 2) Driving method | Current drive | Voltage drive |
| 3) Principle of writing operation | Change Spin Direction of Magnetic Substance | On/off of FET |
| 4) Si LSI | Suitable for bipolar LSI (MOS transistor is preferred in high integration circuit (Bipolar transistor is unsuitable for High Integration); W is large) | Suitable for MOS LSI |
| 5) Overhead | Large (Due to large Joule heat) | Smaller by 2 or 3 or more orders of magnitude (Charge and discharge of parasitic capacitance) |
| 6) Non-volatility | Spin is utilized | Small off-state current is utilized |
| 7) Number of times of reading operation | Unlimited | Unlimited |
| 8) 3D conversion | Difficult (2 layers at most) | Easy (No limitation on the number of layers) |
| 9) Degree of integration ($F^2$) | 4 $F^2$ to 15 $F^2$ | Depending on the number of layers in 3D conversion |
| 10) Material | Rare-earth element with magnetic property | Oxide semiconductor material |
| 11) Resistance to magnetic field | Low | High |

As shown in Table 2, the memory in which a transistor including an oxide semiconductor and a transistor including silicon are combined is significantly different from the spintronics device in the driving method, the principle of writing operation, the material, and the like.

Further, as shown in Table 2, the memory in which the transistor including an oxide semiconductor and the transistor including silicon are combined has advantages over the spintronics device in many aspects such as the heat resistance, the 3D conversion (stacked-layer structure with three or more layers), and the resistance to a magnetic field. Note that the "overhead" in Table 2 means what is called a power consumed by overhead, which is, for example, power for writing data into a memory portion or the like in a processor.

As described above, the use of the memory including an oxide semiconductor, which has more advantages than the spintronics device, makes it possible to reduce power consumption of a CPU.

The structures, methods, and the like which are described in this embodiment can be combined as appropriate with any of the structures, methods, and the like which are described in the other embodiments.

Embodiment 6

A semiconductor device disclosed in this specification can be applied to a variety of electronic devices (including an amusement machine). Examples of electronic devices include the following: display devices such as televisions and monitors, lighting devices, desktop or laptop personal computers, word processors, image reproduction devices which reproduce still images or moving images stored in recording media such as digital versatile discs (DVDs), portable CD players, radio receivers, tape recorders, headphone stereos, stereos, cordless phone handsets, transceivers, portable wireless devices, cellular phones, car phones, portable game machines, calculators, portable information terminals, electronic notebooks, e-book readers, electronic translators, audio input devices, video cameras, digital still cameras, electric shavers, high-frequency heating appliances such as microwave ovens, electric rice cookers, electric washing machines, electric vacuum cleaners, air-conditioning systems such as air conditioners, dish washing machines, dish drying machines, clothes dryers, futon dryers, electric refrigerators, electric freezers, electric refrigerator-freezers, freezers for preserving DNA, smoke detectors, radiation counters, medical equipment such as dialyzers. Further examples include industrial equipment such as guide lights, traffic lights, belt conveyors, elevators, escalators, industrial robots, and power storage systems. In addition, oil engines, moving objects driven by electric motors using power from non-aqueous secondary batteries, and the like are also included in the range of electronic devices. Examples of the moving objects include electric vehicles (EV), hybrid electric vehicles (HEV) which include both an internal-combustion engine and a motor, plug-in hybrid electric vehicles (PHEV), tracked vehicles in which caterpillar tracks are substituted for wheels of these vehicles, motorized bicycles including motor-assisted bicycles, motorcycles, electric wheelchairs, golf carts, boats or ships, submarines, helicopters, aircrafts, rockets, artificial satellites, space probes, planetary probes, spacecrafts, and the like. Specific examples of these electronic devices are illustrated in FIGS. 6A to 6C.

Figure 6A:
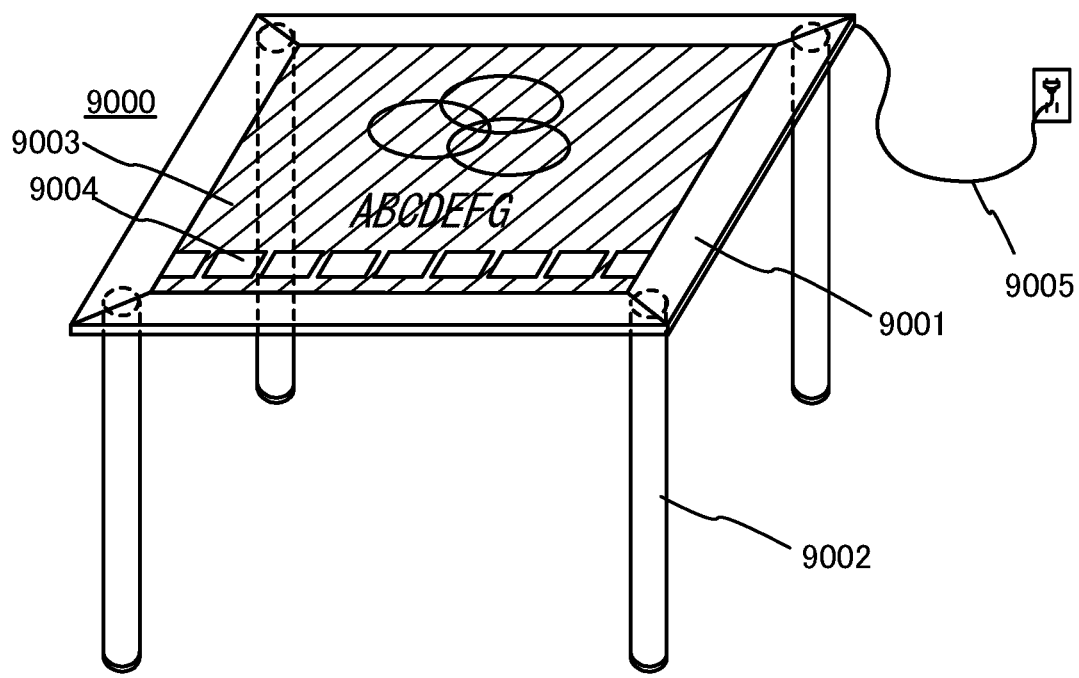
FIGS. 6A to 6C illustrate electronic devices.
Figure 6B:
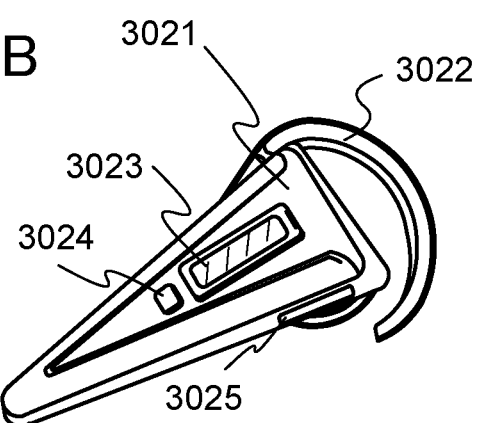
Figure 6C:
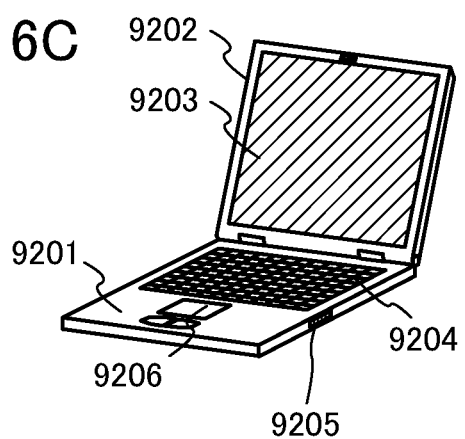

FIG. 6A illustrates a table 9000 having a display portion. In the table 9000, a display portion 9003 is incorporated in a housing 9001 and an image can be displayed on the display portion 9003. Note that the housing 9001 is supported by four leg portions 9002. Further, the housing 9001 is provided with a power cord 9005 for supplying power.

The transistor described in Embodiment 1 can be used in the display portion 9003 so that the electronic device can have high reliability.

The display portion 9003 has a touch-input function. When a user touches displayed buttons 9004 which are displayed on the display portion 9003 of the table 9000 with his/her finger or the like, the user can carry out operation of the screen and input of information. Further, when the table is capable of communicating with other home appliances or control the home appliances, the table 9000 may function as a control device which controls the home appliances by operation on the screen. For example, with the use of a semiconductor device having an image sensing function, the display portion 9003 can have a touch-input function.

Further, the screen of the display portion 9003 can be placed perpendicular to a floor with a hinge provided for the housing 9001; thus, the table 9000 can also be used as a television device. When a television device having a large screen is set in a small room, an open space is reduced; however, when a display portion is incorporated in a table, a space in the room can be efficiently used.

FIG. 6B illustrates a portable music player, which includes, in a main body 3021, a display portion 3023, a fixing portion 3022 with which the main body is worn on the ear, an operation button 3024, an external connection port 3025, and the like. The portable music player may include a speaker. When the transistor described in Embodiment 1 or any of the memories or logic circuits described in Embodiments 2 to 4 is applied to a memory, a CPU, or the like included in the main body 3021, a portable music player (PDA) whose power consumption is reduced can be provided.

Furthermore, when the portable music player illustrated in FIG. 6B has an antenna, a microphone function, or a wireless communication function and is used with a mobile phone, a user can talk on the phone wirelessly in a hands-free way while driving a car or the like.

FIG. 6C illustrates a computer, which includes a main body 9201 including a CPU, a housing 9202, a display portion 9203, a keyboard 9204, an external connection port 9205, a pointing device 9206, and the like. The computer is manufactured using a semiconductor device manufactured according to one embodiment of the present invention for the display portion 9203. When the CPU described in Embodiment 5 is used, power consumption of the computer can be reduced.

Figure 7A:
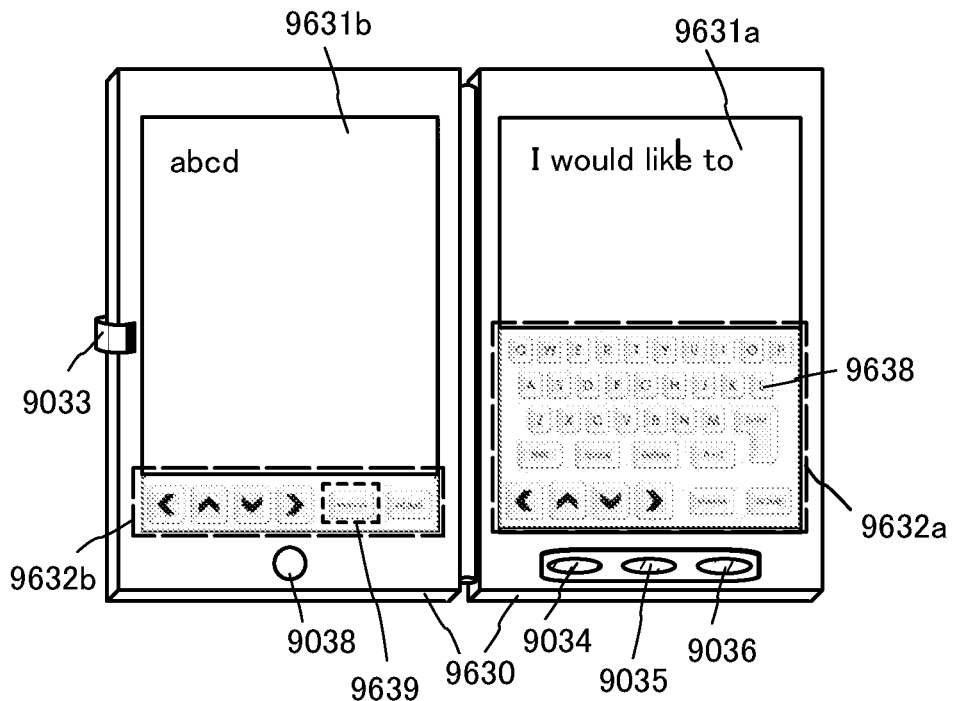
FIGS. 7A to 7C illustrate an electronic device.
Figure 7B:
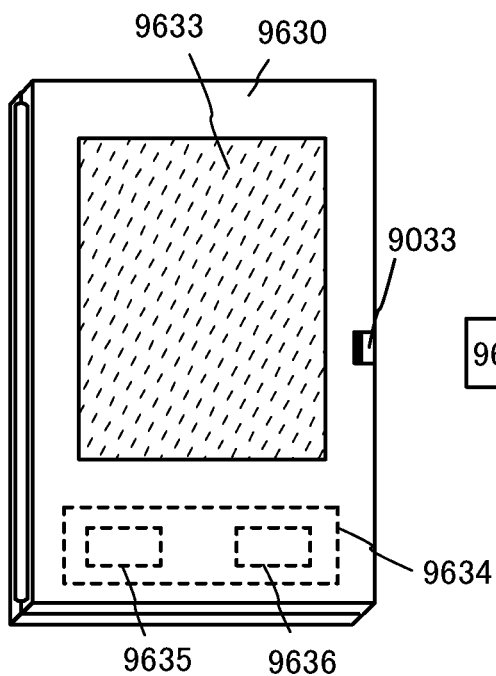

FIGS. 7A and 7B illustrate a foldable tablet terminal. The tablet terminal is opened in FIG. 7A. The tablet terminal includes a housing 9630, a display portion 9631*a*, a display portion 9631*b*, a display mode switch 9034, a power switch 9035, a power saver switch 9036, a clasp 9033, and an operation switch 9038.

In the portable device illustrated in FIGS. 7A and 7B, a memory such as an SRAM or a DRAM is used for temporarily storing image data or the like. For example, the semiconductor device described in Embodiment 2 or 3 can be used as a memory. By employing the semiconductor device described in the above embodiment for the memory, data can be written and read at high speed and held for a long time, and power consumption can be sufficiently reduced.

Part of the display portion 9631*a* can be a touch panel region 9632*a* and data can be input when a displayed operation key 9638 is touched. Although a structure in which a half region in the display portion 9631*a* has only a display function and the other half region has a touch panel function is shown as an example, the display portion 9631*a* is not limited to this structure. The whole region in the display portion 9631*a* may have a touch panel function. For example, the display portion 9631*a* can display keyboard buttons in its whole region to serve as a touch panel, and the display portion 9631*b* can be used as a display screen.

As in the display portion 9631*a*, part of the display portion 9631*b* can be a touch panel region 9632*b*. When a keyboard display switching button 9639 displayed on the touch panel is touched with a finger, a stylus, or the like, a keyboard can be displayed on the display portion 9631*b*.

Touch input can be performed in the touch panel region 9632a and the touch panel region 9632b at the same time.

The display mode switch 9034 can switch the display between portrait mode, landscape mode, and the like, and between monochrome display and color display, for example. The power saver switch 9036 can control display luminance in accordance with the amount of external light in use of the tablet terminal detected by an optical sensor incorporated in the tablet terminal. In addition to the optical sensor, another detection device including a sensor for detecting inclination, such as a gyroscope or an acceleration sensor, may be incorporated in the tablet terminal.

Note that FIG. 7A shows an example in which the display portion 9631a and the display portion 9631b have the same display area; however, without limitation, one of the display portions may be different from the other display portion in size and display quality. For example, one display panel may be capable of higher-definition display than the other display panel.

The tablet terminal is closed in FIG. 7B. The tablet terminal includes the housing 9630, a solar cell 9633, a charge and discharge control circuit 9634, a battery 9635, and a DCDC converter 9636. In FIG. 7B, a structure including the battery 9635 and the DCDC converter 9636 is illustrated as an example of the charge and discharge control circuit 9634.

Since the tablet terminal is foldable, the housing 9630 can be closed when the tablet terminal is not used. As a result, the display portion 9631a and the display portion 9631b can be protected; thus, a tablet terminal which has excellent durability and excellent reliability in terms of long-term use can be provided.

In addition, the tablet terminal illustrated in FIGS. 7A and 7B can have a function of displaying a variety of kinds of data (e.g., a still image, a moving image, and a text image), a function of displaying a calendar, a date, the time, or the like on the display portion, a touch-input function of operating or editing the data displayed on the display portion by touch input, a function of controlling processing by a variety of kinds of software (programs), and the like.

The solar cell 9633 provided on a surface of the tablet terminal can supply power to the touch panel, the display portion, a video signal processing portion, or the like. Note that the solar cell 9633 can be provided on one or both surfaces of the housing 9630, and the battery 9635 can be charged efficiently. The use of a lithium ion battery as the battery 9635 is advantageous in downsizing or the like.

Figure 7C:
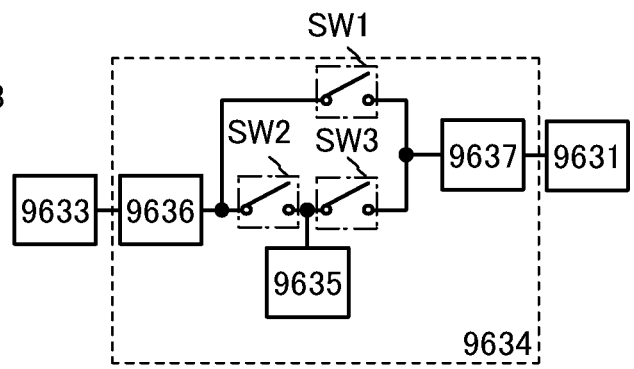

The structure and the operation of the charge and discharge control circuit 9634 illustrated in FIG. 7B will be described with reference to a block diagram in FIG. 7C. The solar cell 9633, the battery 9635, the DCDC converter 9636, a converter 9637, switches SW1 to SW3, and a display portion 9631 are illustrated in FIG. 7C, and the battery 9635, the DCDC converter 9636, the converter 9637, and the switches SW1 to SW3 correspond to the charge and discharge control circuit 9634 illustrated in FIG. 7B.

First, an example of the operation in the case where power is generated by the solar cell 9633 using external light is described. The voltage of power generated by the solar cell is stepped up or down by the DCDC converter 9636 so that the power has a voltage for charging the battery 9635. Then, when the power from the solar cell 9633 is used for the operation of the display portion 9631, the switch SW1 is turned on and the voltage of the power is stepped up or down by the converter 9637 so as to be a voltage needed for the display portion 9631. In addition, when display on the display portion 9631 is not performed, the switch SW1 is turned off and the switch SW2 is turned on so that the battery 9635 may be charged.

Note that the solar cell 9633 is described as an example of a power generation means; however, without limitation, the battery 9635 may be charged using another power generation means such as a piezoelectric element or a thermoelectric conversion element (Peltier element). For example, a non-contact electric power transmission module which transmits and receives power wirelessly (without contact) to charge the battery 9635, or a combination of the solar cell 9633 and another means for charge may be used.

Figure 8A:
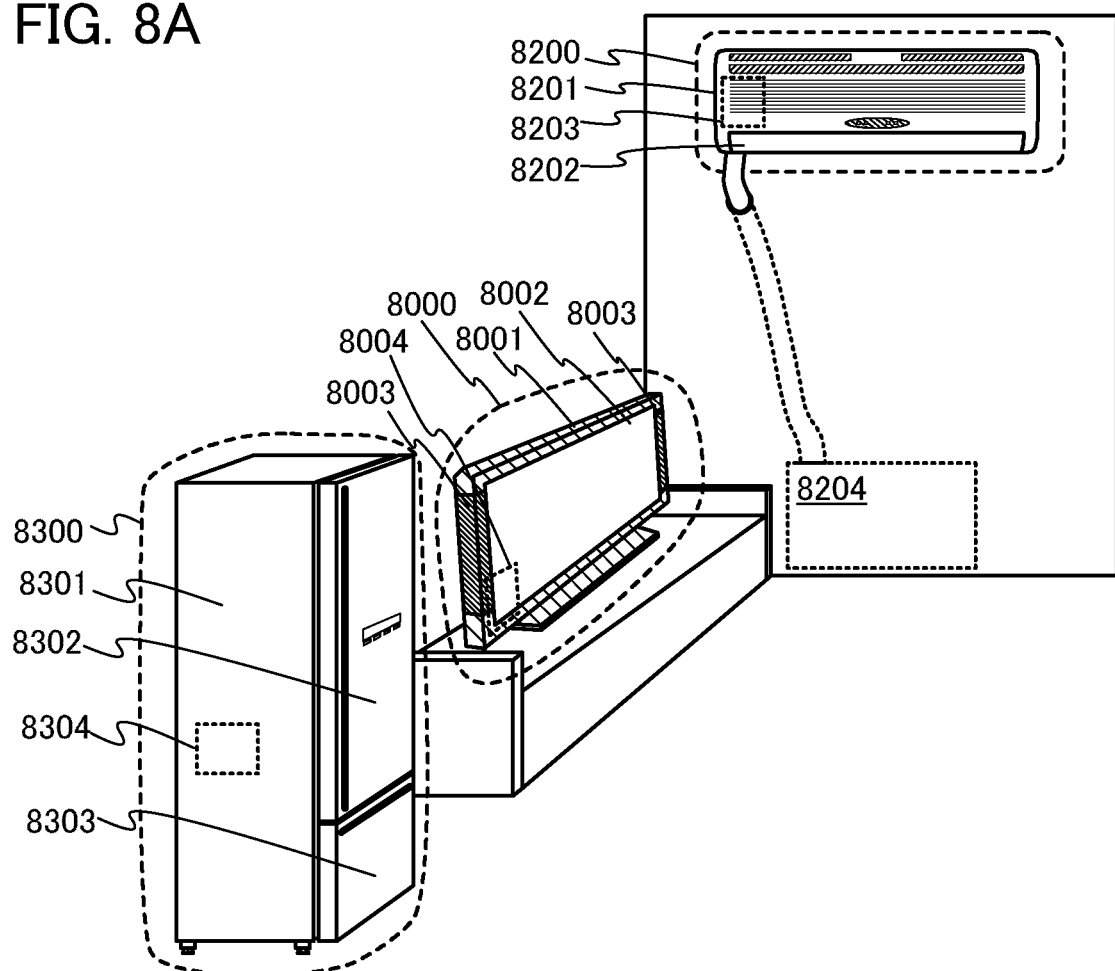
FIGS. 8A to 8C illustrate electronic devices.

In a television device 8000 in FIG. 8A, a display portion 8002 is incorporated in a housing 8001. The display portion 8002 displays an image and a speaker portion 8003 can output sound. The transistor described in Embodiment 1 can be used in the display portion 8002.

A semiconductor display device such as a liquid crystal display device, a light-emitting device in which a light-emitting element such as an organic EL element is provided in each pixel, an electrophoresis display device, a digital micromirror device (DMD), a plasma display panel (PDP), or the like can be used in the display portion 8002.

The television device 8000 may be provided with a receiver, a modem, and the like. With the receiver, the television device 8000 can receive general television broadcasting. Furthermore, when the television device 8000 is connected to a communication network by wired or wireless connection via the modem, one-way (from a transmitter to a receiver) or two-way (between a transmitter and a receiver, between receivers, or the like) data communication can be performed.

In addition, the television device 8000 may include a CPU for performing information communication or a memory. Any of the memories, logic circuits, or CPU described in Embodiments 2 to 5 can be used in the television device 8000.

In FIG. 8A, an air conditioner including an indoor unit 8200 and an outdoor unit 8204 is an example of an electronic device including the CPU of Embodiment 5. Specifically, the indoor unit 8200 includes a housing 8201, a ventilation duct 8202, a CPU 8203, and the like. FIG. 8A shows the case where the CPU 8203 is provided in the indoor unit 8200; the CPU 8203 may be provided in the outdoor unit 8204. Alternatively, the CPU 8203 may be provided in both the indoor unit 8200 and the outdoor unit 8204. Since the CPU described in Embodiment 5 is formed using an oxide semiconductor, an air conditioner which has excellent heat resistance and high reliability can be provided with the use of the CPU.

In FIG. 8A, an electric refrigerator-freezer 8300 is an example of an electronic device which is provided with the CPU formed using an oxide semiconductor. Specifically, the electric refrigerator-freezer 8300 includes a housing 8301, a refrigerator door 8302, a freezer door 8303, a CPU 8304, and the like. The CPU 8304 is provided in the housing 8301 in FIG. 8A. When the CPU described in Embodiment 5 is used as the CPU 8304 of the electric refrigerator-freezer 8300, power saving can be achieved.

Figure 8B:
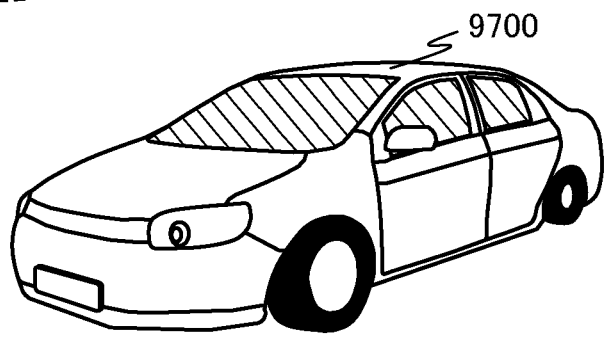
Figure 8C:
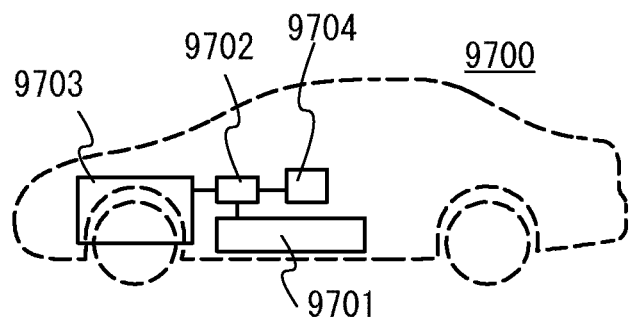
Figure 9:
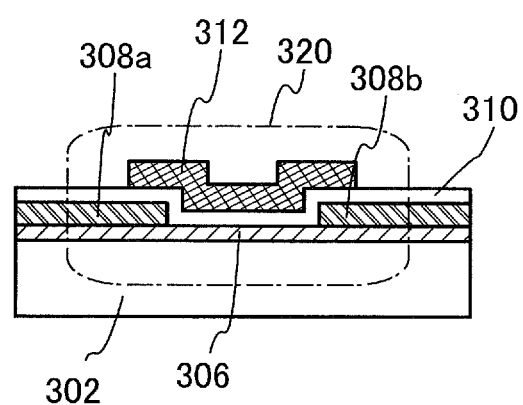
FIG. 9 illustrates a transistor structure used in calculation.
Figure 10A:
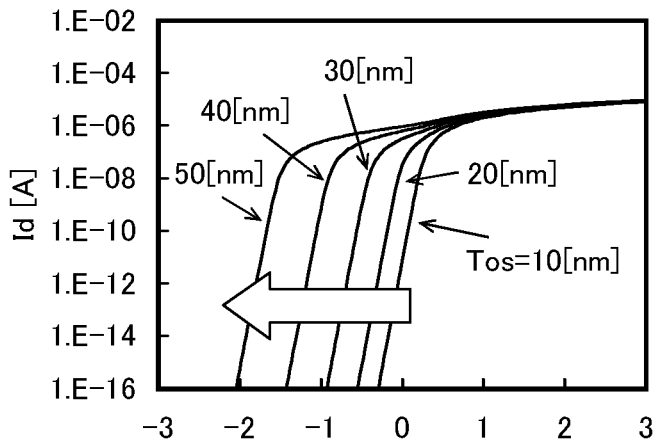
FIGS. 10A to 10C show $I_d$-$V_g$ characteristics obtained by calculation.
Figure 10B:
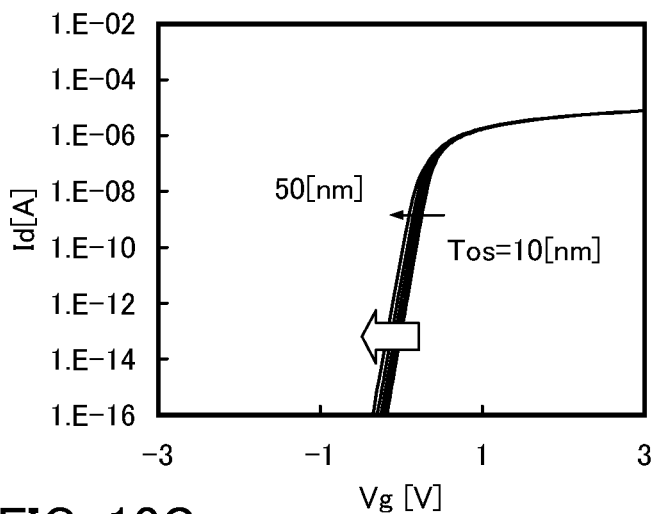
Figure 10C:
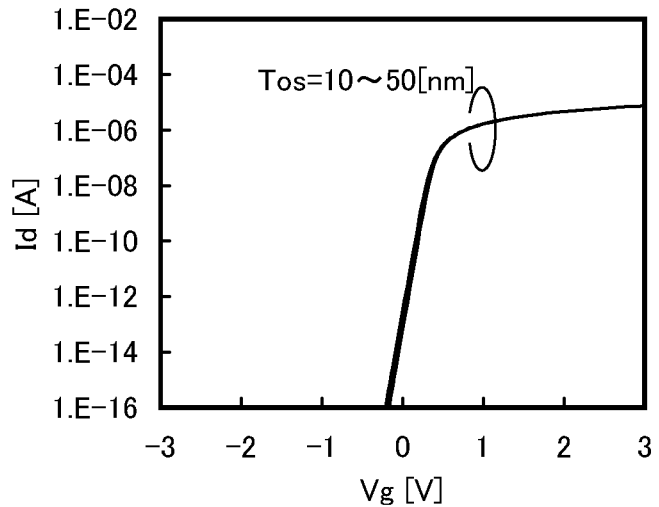
Figure 11A:
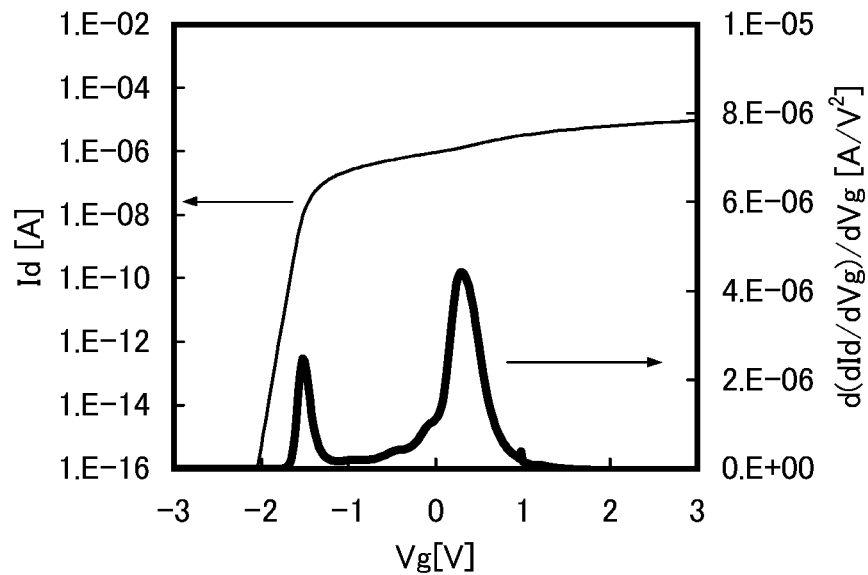
FIG. 11A is a graph showing $I_d V_g$ characteristics and a line obtained by second-order differentiation of the $I_d V_g$ characteristics and FIG. 11B shows current density distributions in a film thickness direction at several gate voltages.
Figure 11B:
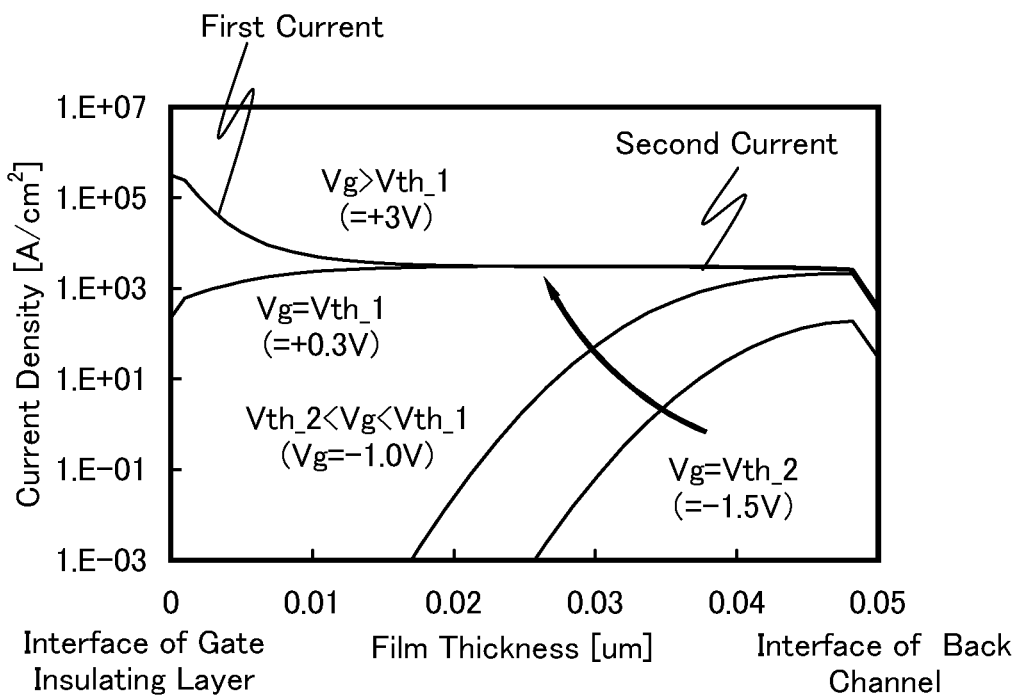
Figure 12:
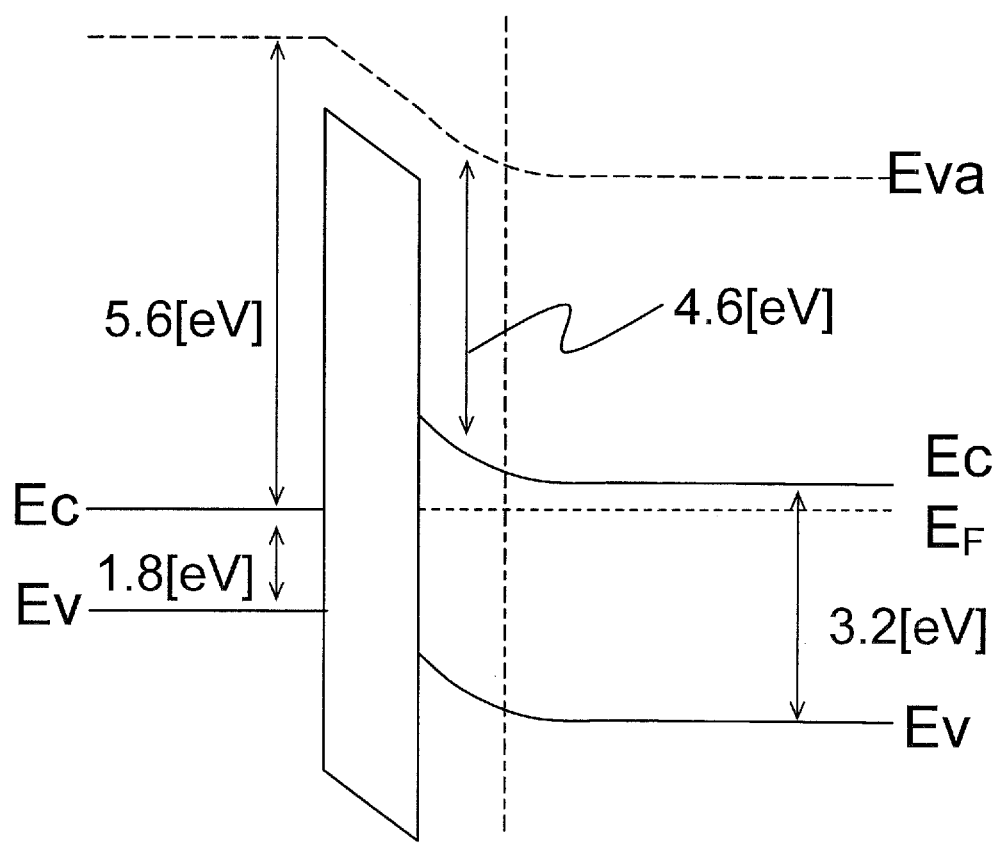
FIG. 12 is a schematic view of a band structure in an OSFET model.

FIGS. 8B and 8C illustrates an example of an electric vehicle which is an example of an electronic device. An electric vehicle 9700 is equipped with a secondary battery 9701. The output of power of the secondary battery 9701 is controlled by a control circuit 9702 and the power is supplied to a driving device 9703. The control circuit 9702 is controlled by a processing unit 9704 including a ROM, a RAM, a CPU, or the like which is not illustrated. When the CPU described in Embodiment 5 is used as the CPU in the electric vehicle 9700, power saving can be achieved.

The driving device 9703 includes a DC motor or an AC motor either alone or in combination with an internal-combustion engine. The processing unit 9704 outputs a control signal to the control circuit 9702 based on input data such as data of operation (e.g., acceleration, deceleration, or stop) by a driver or data during driving (e.g., data on an upgrade or a downgrade, or data on a load on a driving wheel) of the electric vehicle 9700. The control circuit 9702 adjusts the electric energy supplied from the secondary battery 9701 in accordance with the control signal of the processing unit 9704 to control the output of the driving device 9703. In the case where the AC motor is mounted, although not illustrated, an inverter which converts direct current into alternate current is also incorporated.

The structures, methods, and the like which are described in this embodiment can be combined as appropriate with any of the structures, methods, and the like which are described in the other embodiments.

EXPLANATION OF REFERENCE

100: substrate, 102: gate electrode layer, 103: insulating layer, 104: insulating layer, 106: oxide semiconductor stacked layers, 106a: oxide semiconductor layer, 106b: oxide semiconductor layer, 108: conductive film, 108a: source electrode layer, 108b: drain electrode layer, 110: insulating layer, 112: gate electrode layer, 120: transistor, 160: transistor, 162: transistor, 164: capacitor, 200: substrate, 202a: electrode layer, 202b: gate electrode layer, 203: insulating layer, 204: insulating layer, 206: element isolation insulating layer, 208: gate insulating layer, 210: gate electrode layer, 212a: electrode layer, 212b: electrode layer, 214: impurity region, 216: channel formation region, 218: sidewall insulating layer, 220: high-concentration impurity region, 222a: electrode layer, 222b: wiring layer, 224: intermetallic compound region, 228: insulating layer, 230: insulating layer, 232: insulating layer, 234: insulating layer, 236: insulating layer, 244: oxide semiconductor stacked layers, 244a: oxide semiconductor layer, 244b: oxide semiconductor layer, 250: memory cell, 251: memory cell array, 251a: memory cell array, 251b: memory cell array, 253: conductive layer, 254: capacitor, 256: wiring layer, 258: peripheral circuit, 260: gate insulating layer, 262: gate electrode layer, 268a: electrode layer, 268b: electrode layer, 302: insulating layer, 306: oxide semiconductor layer, 308a: source electrode layer, 308b: drain electrode layer, 310: gate insulating layer, 320: transistor, 402: oxygen-excess region, 405a: source electrode layer, 405b: drain electrode layer, 400: oxygen, 800: substrate, 801: transistor, 802: transistor, 803: transistor, 804: transistor, 806: element isolation insulating layer, 811: transistor, 812: transistor, 813: transistor, 814: transistor, 821: gate electrode layer, 825: electrode layer, 826: insulating layer, 830: insulating layer, 831: electrode layer, 832: wiring layer, 833: insulating layer, 834: wiring layer, 835: electrode layer, 836: insulating layer, 839: insulating layer, 840: gate electrode layer, 841a: gate electrode layer, 841b: electrode layer, 843: gate insulating layer, 845: electrode layer, 1141: switching element, 1142: memory cell, 1143: memory cell group, 1189: ROM interface, 1190: substrate, 1191: ALU, 1192: ALU controller, 1193: instruction decoder, 1194: interrupt controller, 1195: timing controller, 1196: register, 1197: register controller, 1198: bus interface, 1199: ROM, 3021: main body, 3022: fixing portion, 3023: display portion, 3024: operation button, 3025: external connection port, 8000: television device, 8001: housing, 8002: display portion, 8003: speaker portion, 8200: indoor unit, 8201: housing, 8202: ventilation duct, 8203: CPU, 8204: outdoor unit, 8300: electric refrigerator-freezer, 8301: housing, 8302: refrigerator door, 8303: freezer door, 8304: CPU, 9000: table, 9001: housing, 9002: leg portions, 9003: display portion, 9004: displayed buttons, 9005: power cord, 9033: clasp, 9034: switch, 9035: power switch, 9036: switch, 9038: operation switch, 9201: main body, 9202: housing, 9203: display portion, 9204: keyboard, 9205: external connection port, 9206: pointing device, 9630: housing, 9631: display portion, 9631a: display portion, 9631b: display portion, 9632a: region, 9632b: region, 9633: solar cell, 9634: charge and discharge control circuit, 9635: battery, 9636: DCDC converter, 9637: converter, 9638: operation key, 9639: button, 9700: electric vehicle, 9701: secondary battery, 9702: control circuit, 9703: driving device, 9704: processing unit.

This application is based on Japanese Patent Application serial no. 2012-091539 filed with Japan Patent Office on Apr. 13, 2012, the entire contents of which are hereby incorporated by reference.

The invention claimed is:

1. A semiconductor device comprising:
a first conductive layer over an insulating surface;
a first insulating layer over the first conductive layer;
an oxide semiconductor layer comprising a first oxide semiconductor layer and a second oxide semiconductor layer, the oxide semiconductor layer comprises a region overlapping the first conductive layer with the first insulating layer interposed therebetween;
a second conductive layer and a third conductive layer, each of which comprises a region in contact with a top surface of the second oxide semiconductor layer and a region in contact with a side surface of the first oxide semiconductor layer and the second oxide semiconductor layer;
a second insulating layer comprising a region in contact with the oxide semiconductor layer and positioned over the oxide semiconductor layer, the second conductive layer, and the third conductive layer; and
a fourth conductive layer comprising a region overlapping the oxide semiconductor layer with the second insulating layer interposed therebetween,
wherein the second oxide semiconductor layer is provided over the first oxide semiconductor layer,
wherein the first oxide semiconductor layer comprises a region in contact with the first insulating layer,
wherein each of the first oxide semiconductor layer and the second oxide semiconductor layer comprises at least indium and gallium,
wherein the first oxide semiconductor layer further comprises tin,
wherein a thickness of the first oxide semiconductor layer is more than or equal to 3 nm and less than or equal to 15 nm,
wherein one of the first oxide semiconductor layer and the second oxide semiconductor layer comprises a c-axis aligned crystal part,
wherein a third insulating layer is provided over the second insulating layer,
wherein the third conductive layer is in contact with the fourth conductive layer in an opening provided in the second insulating layer and the third insulating layer, and
wherein the first conductive layer comprises molybdenum, titanium, tantalum, tungsten, aluminum, copper, chromium, neodymium, or scandium.

2. The semiconductor device according to claim 1,
wherein the second conductive layer and the third conductive layer have a tapered side surface, and
wherein a fifth conductive layer overlaps the fourth conductive layer.

3. The semiconductor device according to claim 2,
wherein the fourth conductive layer is provided over and in contact with a fourth insulating layer provided over the third insulating layer,
wherein the third conductive layer extends beyond the opening provided in the second insulating layer and the third insulating layer, and
wherein the fifth conductive layer and the fourth conductive layer overlap the second conductive layer.

4. The semiconductor device according to claim 1,
wherein the first oxide semiconductor layer and the second oxide semiconductor layer have crystallinity.

5. The semiconductor device according to claim 1,
wherein a state of crystallinity of the first semiconductor layer and a state of crystallinity of the second oxide semiconductor layer differ from each other.

6. A semiconductor device comprising:
a first conductive layer;
a first insulating layer over the first conductive layer;
an oxide semiconductor layer comprising a first oxide semiconductor layer and a second oxide semiconductor layer, the oxide semiconductor layer comprises a region overlapping the first conductive layer with the first insulating layer interposed therebetween;
a second conductive layer and a third conductive layer, each of which is electrically connected to and provided over the oxide semiconductor layer;
a second insulating layer comprising a region in contact with the oxide semiconductor layer and positioned over the oxide semiconductor layer, the second conductive layer, and the third conductive layer;
a third insulating layer provided over the second insulating layer;
a fourth conductive layer overlapping the oxide semiconductor layer and/or with a channel region of the oxide semiconductor layer; and
a fifth conductive layer in contact with the third conductive layer in an opening provided in the second insulating layer and the third insulating layer,
wherein a first side surface of the first oxide semiconductor layer and the second oxide semiconductor layer is in contact with the second conductive layer,
wherein a second side surface of the first oxide semiconductor layer and the second oxide semiconductor layer is in contact with the third conductive layer,
wherein each of the first oxide semiconductor layer and the second oxide semiconductor layer comprises at least indium, gallium, and zinc, and
wherein the first conductive layer comprises molybdenum, titanium, tantalum, tungsten, aluminum, copper, chromium, neodymium, or scandium.

7. The semiconductor device according to claim 6,
wherein the second conductive layer and the third conductive layer have a tapered side surface, and
wherein the fifth conductive layer overlaps the fourth conductive layer.

8. The semiconductor device according to claim 7,
wherein the fifth conductive layer is provided over and in contact with a fourth insulating layer provided over the third insulating layer,
wherein the third conductive layer extends beyond the opening provided in the second insulating layer, the third insulating layer, and the fourth insulating layer, and
wherein the fifth conductive layer and the fourth conductive layer overlap the second conductive layer.

9. The semiconductor device according to claim 6,
wherein one of the first oxide semiconductor layer and the second oxide semiconductor layer has crystallinity.

10. The semiconductor device according to claim 6,
wherein the first oxide semiconductor layer and the second oxide semiconductor layer have crystallinity.

11. The semiconductor device according to claim 6,
wherein a state of crystallinity of the first semiconductor layer and a state of crystallinity of the second oxide semiconductor layer differ from each other.

12. The semiconductor device according to claim 6,
wherein one of the first oxide semiconductor layer and the second oxide semiconductor layer is a microcrystalline oxide semiconductor layer, and
wherein the other of the first oxide semiconductor layer and the second semiconductor layer is an amorphous oxide semiconductor layer, a single-crystal semiconductor layer, a polycrystalline oxide semiconductor layer, or a c-axis aligned crystalline oxide semiconductor layer.

13. A semiconductor device comprising:
a substrate;
a first conductive layer over the substrate;
a first insulating layer over the first conductive layer;
an oxide semiconductor layer comprising a first oxide semiconductor layer and a second oxide semiconductor layer, the oxide semiconductor layer comprises a region overlapping the first conductive layer with the first insulating layer interposed therebetween;
a second conductive layer and a third conductive layer, each of which is electrically connected to the first oxide semiconductor layer and the second oxide semiconductor layer;
a second insulating layer comprising a region in contact with the oxide semiconductor layer and positioned over the oxide semiconductor layer, the second conductive layer, and the third conductive layer;
a third insulating layer provided over the second insulating layer;
a fourth insulating layer provided over the third insulating layer; and
a fourth conductive layer provided over the fourth insulating layer,
wherein each of the first oxide semiconductor layer and the second oxide semiconductor layer comprises at least indium and gallium,
wherein the second conductive layer and the third conductive layer each contain an element selected from Al, Cr, Cu, Ta, Ti, Mo, or W,
wherein the fourth conductive layer is in contact with the third conductive layer in an opening provided in the second insulating layer and the third insulating layer,
wherein the third conductive layer extends beyond the opening provided in the second insulating layer and the third insulating layer,
wherein the second conductive layer and the third conductive layer are each in contact with a side surface of the oxide semiconductor layer, and
wherein the fourth conductive layer overlaps the second conductive layer and the oxide semiconductor layer.

14. The semiconductor device according to claim 13,
wherein the second conductive layer and the third conductive layer have a tapered side surface, and
wherein one of the first oxide semiconductor layer and the second oxide semiconductor layer comprises a c-axis aligned crystal part.

15. The semiconductor device according to claim 14,
wherein the oxide semiconductor layer is provided in a channel region of a transistor,
wherein the transistor is a channel-etched transistor, and
wherein a fifth conductive layer overlaps the fourth conductive layer.

16. The semiconductor device according to claim 13,
wherein one of the first oxide semiconductor layer and the second oxide semiconductor layer has crystallinity.

17. The semiconductor device according to claim 13,
wherein the first oxide semiconductor layer and the second oxide semiconductor layer have crystallinity.

18. The semiconductor device according to claim 13,
wherein a state of crystallinity of the first semiconductor layer and a state of crystallinity of the second oxide semiconductor layer differ from each other.

19. The semiconductor device according to claim 13,
wherein one of the first oxide semiconductor layer and the second oxide semiconductor layer is a microcrystalline oxide semiconductor layer, and
wherein the other of the first oxide semiconductor layer and the second semiconductor layer is an amorphous oxide semiconductor layer, a single-crystal semiconductor layer, a polycrystalline oxide semiconductor layer, or a c-axis aligned crystalline oxide semiconductor layer.

* * * * *